US009935118B1

(12) United States Patent
Inatsuka et al.

(10) Patent No.: US 9,935,118 B1
(45) Date of Patent: Apr. 3, 2018

(54) SEMICONDUCTOR MEMORY DEVICE

(71) Applicant: Toshiba Memory Corporation, Minato-ku (JP)

(72) Inventors: Takuya Inatsuka, Yokkaichi (JP); Tadashi Iguchi, Yokkaichi (JP); Murato Kawai, Yokkaichi (JP); Hisashi Kato, Yokkaichi (JP); Megumi Ishiduki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/462,118

(22) Filed: Mar. 17, 2017

Related U.S. Application Data

(60) Provisional application No. 62/393,835, filed on Sep. 13, 2016.

(51) Int. Cl.
H01L 27/11565 (2017.01)
H01L 27/11524 (2017.01)
H01L 27/11556 (2017.01)
H01L 27/11519 (2017.01)
H01L 27/1157 (2017.01)
H01L 27/11582 (2017.01)

(52) U.S. Cl.
CPC .... H01L 27/11565 (2013.01); H01L 27/1157 (2013.01); H01L 27/11519 (2013.01); H01L 27/11524 (2013.01); H01L 27/11556 (2013.01); H01L 27/11582 (2013.01)

(58) Field of Classification Search
CPC ......... H01L 27/11565; H01L 27/11519; H01L 27/11524
See application file for complete search history.

(56) References Cited

U.S. PATENT DOCUMENTS

| 2008/0157092 | A1* | 7/2008 | Arai | ............ H01L 27/115 257/67 |
|---|---|---|---|---|
| 2010/0097859 | A1 | 4/2010 | Shim et al. | |
| 2014/0284675 | A1 | 9/2014 | Watanabe | |
| 2014/0286095 | A1 | 9/2014 | Hishida et al. | |

FOREIGN PATENT DOCUMENTS

| JP | 2014-183225 | 9/2014 |
|---|---|---|
| JP | 2014-187176 | 10/2014 |

* cited by examiner

Primary Examiner — Walter H Swanson
(74) Attorney, Agent, or Firm — Oblon, McClelland, Maier & Neustadt, L.L.P.

(57) ABSTRACT

According to one embodiment, a semiconductor memory device includes a first conductive layer, a first semiconductor body, a second semiconductor body, a first memory layer, and a second memory layer. The first conductive layer includes first to fourth extension regions, and a first connection region. The first extension region extends in a first direction. The second extension region extends in the first direction and is arranged with the first extension region in the first direction. The third extension region extends in the first direction and is arranged with the first extension region in a second direction crossing the first direction. The fourth extension region extends in the first direction, is arranged with the third extension region in the first direction, and is arranged with the second extension region in the second direction.

20 Claims, 18 Drawing Sheets

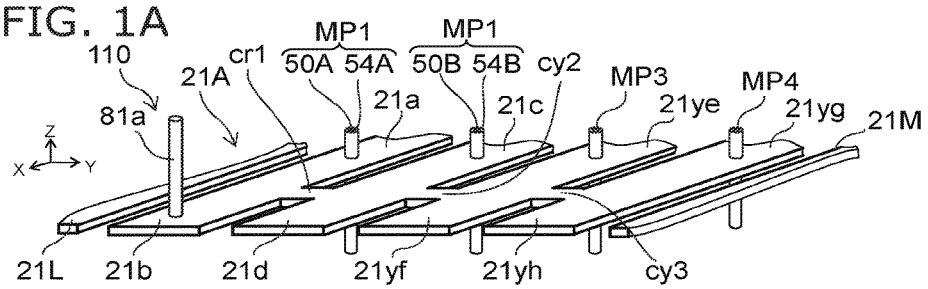
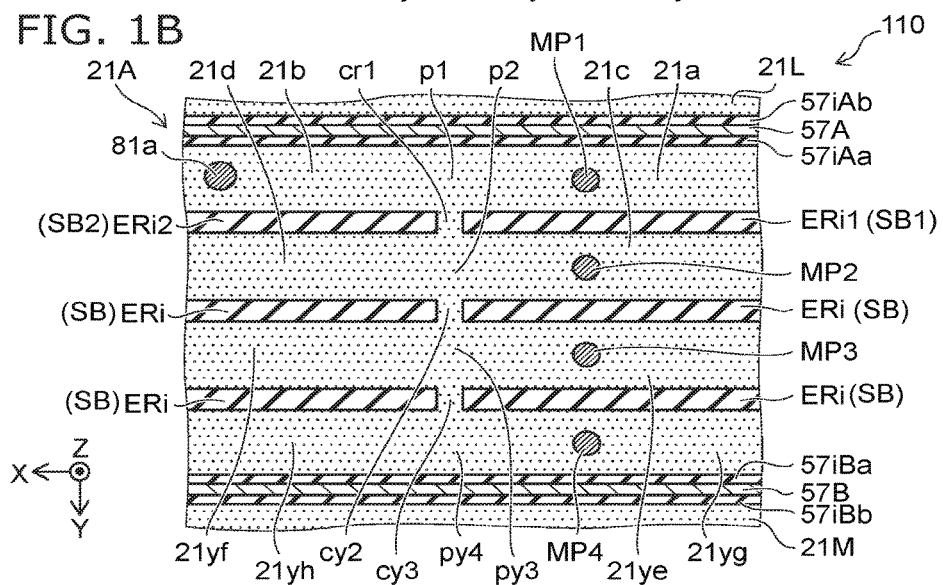
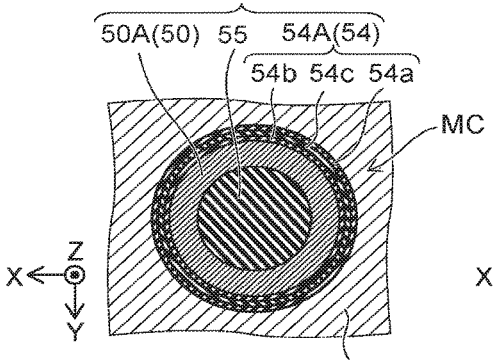
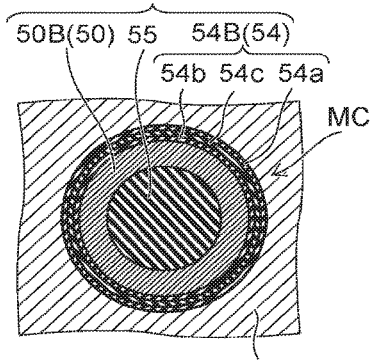

SEMICONDUCTOR MEMORY DEVICE

CROSS-REFERENCE TO RELATED APPLICATIONS

This application is based upon and claims the benefit of priority from U.S. Provisional Patent Application 62/393,835, filed on Sep. 13, 2016; the entire contents of which are incorporated herein by reference.

FIELD

Embodiments described LATER relate generally to a semiconductor memory device.

BACKGROUND

It is desirable to reduce the device surface area of a semiconductor memory device.

BRIEF DESCRIPTION OF THE DRAWINGS

FIG. 1A to FIG. 1D are schematic views illustrating a semiconductor memory device according to a first embodiment;

DETAILED DESCRIPTION

Figure 2:
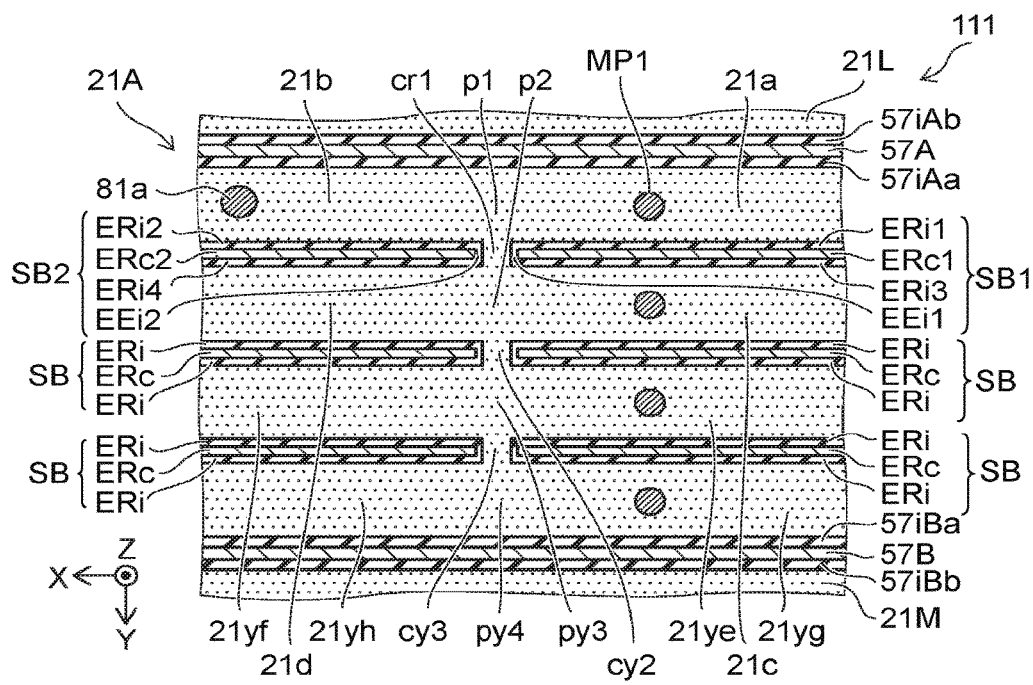
FIG. 2 is a schematic plan view illustrating another semiconductor memory device according to the first embodiment.

According to one embodiment, a semiconductor memory device includes a first conductive layer, a first semiconductor body, a second semiconductor body, a first memory layer, and a second memory layer. The first conductive layer includes first to fourth extension regions, and a first connection region. The first extension region extends in a first direction. The second extension region extends in the first direction and is arranged with the first extension region in the first direction. The third extension region extends in the first direction and is arranged with the first extension region in a second direction crossing the first direction. The fourth extension region extends in the first direction, is arranged with the third extension region in the first direction, and is arranged with the second extension region in the second direction. The first connection region is connected to a portion between the first extension region and the second extension region and to a portion between the third extension region and the fourth extension region. The first semiconductor body extends through the first extension region along a third direction crossing the first direction and the second direction. The second semiconductor body extends through the third extension region along the third direction. The first memory layer is provided between the first semiconductor body and the first extension region. The second memory layer is provided between the second semiconductor body and the third extension region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic views illustrating a semiconductor memory device according to a first embodiment.

FIG. 1A is a perspective view. FIG. 1B is a plan view. FIG. 1C and FIG. 1D are cross-sectional views.

As shown in FIG. 1A, the semiconductor memory device 110 according to the embodiment includes a first conductive layer 21A, a first semiconductor body 50A, a second semiconductor body 50B, a first memory layer 54A, and a second memory layer 54B.

As shown in FIG. 1A and FIG. 1B, the first conductive layer 21A includes first to fourth extension regions 21a to 21d and a first connection region cr1. The first extension region 21a extends in a direction.

The direction is taken as an X-axis direction. One axis perpendicular to the X-axis direction is taken as a Y-axis direction. A direction perpendicular to the X-axis direction and the Y-axis direction is taken as a Z-axis direction.

The second extension region 21b is arranged with the first extension region 21a in the X-axis direction. The second extension region 21b extends in the X-axis direction.

The third extension region 21c is arranged with the first extension region 21a in an other direction crossing the X-axis direction. In the example, the other direction is the Y-axis direction. The third extension region 21c extends in the X-axis direction.

The fourth extension region 21d is arranged with the third extension region 21c in the X-axis direction and arranged with the second extension region 21b in the Y-axis direction. The fourth extension region 21d extends in the X-axis direction.

The first connection region cr1 is connected to a portion p1 between the first extension region 21a and the second extension region 21b and to a portion p2 between the third extension region 21c and the fourth extension region 21d. For example, the first connection region cr1 extends along the Y-axis direction.

Thus, a first band-like portion that includes the first extension region 21a and the second extension region 21b and a second band-like portion that includes the third extension region 21c and the fourth extension region 21d are connected to each other at intermediate portions of the first band-like portion and the second band-like portion. The connection is performed by the first connection region cr1.

The first semiconductor body 50A extends through the first extension region 21a along a further other direction crossing the X-axis direction and the Y-axis direction. In the example, the further other direction is the Z-axis direction.

The second semiconductor body 50B extends through the third extension region 21c along the Z-axis direction.

As shown in FIG. 1C, the first memory layer 54A is provided between the first semiconductor body 50A and the first extension region 21a.

As shown in FIG. 1D, the second memory layer 54B is provided between the second semiconductor body 50B and the third extension region 21c.

Multiple semiconductor bodies 50 are provided in the semiconductor memory device 110. One of the multiple semiconductor bodies 50 corresponds to the first semiconductor body 50A; and one other corresponds to the second semiconductor body 50B. Multiple memory layers 54 are provided respectively between the conductive layer (the first conductive layer 21A) and the multiple semiconductor bodies 50. One of the multiple memory layers 54 corresponds to the first memory layer 54A; and one other corresponds to the second memory layer 54B.

One semiconductor body 50 and one memory layer 54 form one pillar-shaped structure body MP. For example, a first pillar-shaped structure body MP1 includes the first semiconductor body 50A and the first memory layer 54A. A second pillar-shaped structure body MP2 includes the second semiconductor body 50B and the second memory layer 54B.

In the example, the semiconductor body 50 has a tubular configuration. A core insulating portion 55 that extends in the Z-axis direction may be provided inside the semiconductor body 50.

For example, the memory layer 54 has a tubular configuration. For example, the first memory layer 54A includes a memory film 54c, a first memory insulating film 54a, and a second memory insulating film 54b. The first memory insulating film 54a is provided between the memory film 54c and the first conductive layer 21A (the first extension region 21a). The second memory insulating film 54b is provided between the memory film 54c and the first semiconductor body 50A. The second memory layer 54B has a configuration similar to that of the first memory layer 54A; and a description is therefore omitted.

A memory cell MC (a memory transistor) is formed at the portion where the semiconductor body 50 and the conductive layer (e.g., the first conductive layer 21A) cross. For example, the conductive layer (e.g., the first conductive layer 21A) functions as a word line. For example, an end of the semiconductor body 50 is connected to a bit line (not illustrated in the drawing). For example, the other end of the semiconductor body 50 is connected to a source line (not illustrated in the drawing).

For example, the first memory insulating film 54a functions as a blocking insulating film. For example, the second memory insulating film 54b functions as a tunneling insulating film. These insulating films include, for example, silicon oxide, etc. For example, the memory film 54c functions as a charge storage layer. In such a case, the memory film 54c includes, for example, silicon nitride, etc. The memory film 54c may be a floating gate (a floating electrode). In such a case, the memory film 54c includes, for example, polysilicon, etc. The threshold of the memory transistor changes according to the amount of the charge stored in the memory film 54c. The difference (the change) of the threshold corresponds to the information that is stored.

In the example as shown in FIG. 1A and FIG. 1B, the first conductive layer 21A further includes other extension regions 21ye to 21yh. These extension regions extend in the X-axis direction. The band-like portions that include the extension regions are connected by connection regions. For example, the portion p2 recited above and a portion py3 between the extension region 21ye and the extension region 21yf are connected by a connection region cy2. The portion py3 recited above and a portion py4 between the extension region 21yg and the extension region 21yh are connected by a connection region cy3. A third pillar-shaped structure body MP3 that extends through the extension region 21ye in the Z-axis direction is provided; and a fourth pillar-shaped structure body MP4 that extends through the extension region 21yg in the Z-axis direction is provided.

A first connecting body 81a (e.g., a contact electrode or the like) is provided as shown in FIG. 1A. The first connecting body 81a extends in the Z-axis direction. In the example, the first connecting body 81a is electrically connected to the second extension region 21b. For example, in the Z-axis direction, the first connecting body 81a overlaps the second extension region 21b. The first connecting body 81a may be electrically connected to the first conductive layer 21A; and the first connecting body 81a may be connected to another extension region.

In the embodiment, the multiple extension regions that extend in the X-axis direction are connected to each other by the connection regions. Thereby, for example, the electrical connection to the multiple extension regions is possible by connecting a connecting body (e.g., the first connecting body 81*a* or the like) to one of the multiple extension regions. Thereby, the surface area of the connection region for providing the connecting bodies can be reduced. According to the embodiment, for example, a semiconductor memory device can be provided in which a reduction of the device surface area is possible. The multiple extension regions that are connected to each other by the connection regions correspond to one "block."

In the example, structure bodies that include insulating portions are provided between the band-like portions. Namely, the semiconductor memory device 110 further includes a first structure body SB1 and a second structure body SB2. The first structure body SB1 includes a first extension insulating region ERi1. The first extension insulating region ERi1 is provided between the first extension region 21*a* and the third extension region 21*c* and extends in (the X-axis direction. The second structure body SB2 includes a second extension insulating region ERi2. The second extension insulating region ERi2 is provided between the second extension region 21*b* and the fourth extension region 21*d* and extends in the X-axis direction. As described below, these extension insulating regions may have plate configurations along the X-Z plane. These extension insulating regions include, for example, silicon oxide.

In the example, extension insulating regions are provided also between the other band-like portions. Namely, multiple structure bodies SB are provided respectively between the third extension region 21*c* and the extension region 21*ye*, between the fourth extension region 21*d* and the extension region 21*yf*, between the extension region 21*ye* and the extension region 21*yg*, and between the extension region 21*yf* and the extension region 21*yh*. Each of these structure bodies SB includes the extension insulating region ERi.

In the example, conductive layers 21L and 21M that are adjacent to the first conductive layer 21A (the word line) are illustrated. The conductive layers 21L and 21M also function as other word lines. In the example, a conductive portion 57A is provided between the first conductive layer 21A and the conductive layer 21L. Also, a conductive portion 57B is provided between the first conductive layer 21A and the conductive layer 21M. For example, these conductive portions 57A and 57B have plate configurations spreading along the X-Z plane. An end of each of these conductive portions is electrically connected to a conductive member (a not-illustrated semiconductor substrate, etc.). Also, another end of each of these conductive portions is electrically connected to, for example, the source line (not illustrated). The source line and the semiconductor bodies 50 are electrically connected to each other via these conductive portions.

In the example, an insulating portion 57*i*Aa is provided between the conductive portion 57A and the first conductive layer 21A. An insulating portion 57*i*Ab is provided between the conductive portion 57A and the conductive layer 21L. An insulating portion 57*i*Ba is provided between the conductive portion 57B and the first conductive layer 21A. An insulating portion 57*i*Bb is provided between the conductive portion 57B and the conductive layer 21M.

A "replacement method" such as that recited below may be used in the manufacture of the stacked body SB included in the semiconductor memory device 110. For example, a stacked film is formed by multiply stacking a first film (e.g., a silicon nitride film) and a second film (e.g., a silicon oxide film) alternately on a base semiconductor layer (e.g., at least a portion of a semiconductor substrate, etc.). A hole (which may be a slit) that extends in the Z-axis direction is formed in the stacked film; and the first films are removed via the hole. Conductive layers are formed by filling a conductive material into the space formed by removing the first films. The stacked body SB is formed of the conductive layers and the second films recited above.

In the semiconductor memory device 110, for example, the first extension insulating region ERi1 that is included in the first structure body SB1 may include a material included in the first memory layer 54A. The second extension insulating region ERi2 that is included in the second structure body SB2 may include a material included in the first memory layer 54A.

FIG. 2 is a schematic plan view illustrating another semiconductor memory device according to the first embodiment.

FIG. 2 is a plan view corresponding to FIG. 1B. In the other semiconductor memory device 111 according to the embodiment as shown in FIG. 2, an extension conductive layer ERc is further provided in addition to the extension insulating region ERi in the structure body SB. Otherwise, the semiconductor memory device 111 is similar to the semiconductor memory device 110; and a description is therefore omitted.

For example, the first structure body SB1 further includes a third extension insulating region ERi3 and a first extension conductive layer ERc1 in addition to the first extension insulating region ERi1. The third extension insulating region ERi3 is provided between the first extension insulating region ERi1 and the third extension region 21*c* and extends in the X-axis direction. The first extension conductive layer ERc1 is provided between the first extension insulating region ERi1 and the third extension insulating region ERi3 and extends in the X-axis direction.

For example, the second structure body SB2 further includes a fourth extension insulating region ERi4 and a second extension conductive layer ERc2 in addition to the second extension insulating region ERi2. The fourth extension insulating region ERi4 is provided between the second extension insulating region ERi2 and the fourth extension region 21*d* and extends in the X-axis direction. The second extension conductive layer ERc2 is provided between the second extension insulating region ERi2 and the fourth extension insulating region ERi4 and extends in the X-axis direction.

The extension conductive layers ERc (the first extension conductive layer ERc1, the second extension conductive layer ERc2, etc.) may have plate configurations spreading in the X-Z plane.

In the example, an insulating region is provided between the extension conductive layer ERc and the connection region. In other words, the first structure body SB1 further includes a first connection region-side insulating region EEi1. The first connection region-side insulating region EEi1 is provided between the first extension conductive layer ERc1 and the first connection region cr1. The second structure body SB2 further includes a second connection region-side insulating region EEi2. The second connection region-side insulating region EEi2 is provided between the second extension conductive layer ERc2 and the first connection region cr1.

For example, the semiconductor memory device 111 can be made by filling a conductive material in addition to an insulating material into the slit corresponding to the structure body SB in the manufacturing method described in reference to the semiconductor memory device 110 recited above. In the semiconductor memory device 111, for example, at least one of the third extension insulating region ERi3 or the fourth extension insulating region ERi4 may include a material included in the first memory layer 54A. At least one of the first connection region-side insulating region EEi1 or the second connection region-side insulating region EEi2 may include a material included in the first memory layer 54A.

Figure 3:
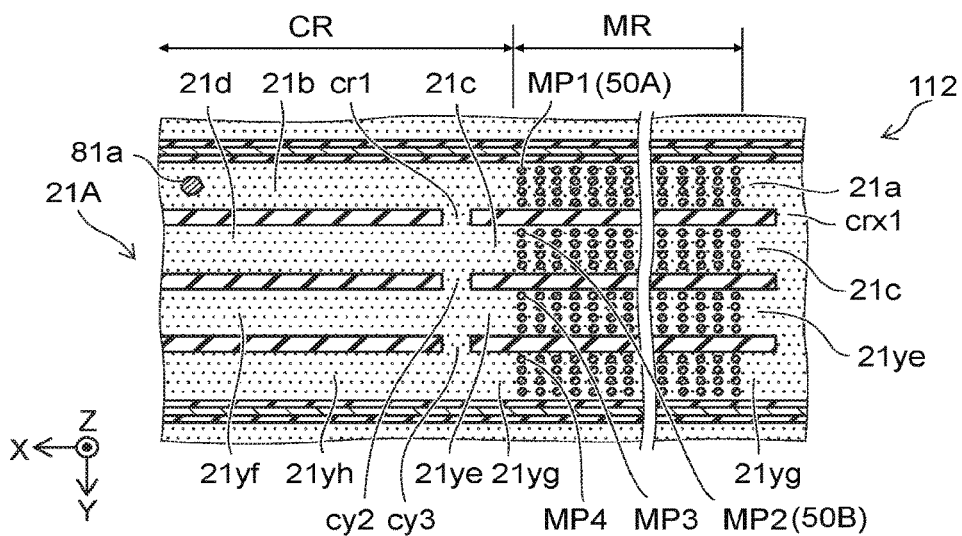
FIG. 3 is a schematic plan view illustrating another semiconductor memory device according to the first embodiment.

FIG. 3 is a schematic plan view illustrating another semiconductor memory device according to the first embodiment.

In the other semiconductor memory device 112 according to the embodiment as shown in FIG. 3, the intermediate portions of the multiple band-like portions are connected to each other by the first connection region cr1, etc. The multiple band-like portions are further connected to each other at other positions (e.g., end portions).

For example, the first conductive layer 21A further includes an end portion connection region crx1. The end portion connection region crx1 is connected to the first extension region 21a and the third extension region 21c. Otherwise, the semiconductor memory device 112 is substantially similar to the semiconductor memory device 110; and a description is therefore omitted.

In a connection region CR, the first connecting body 81a is connected to the second extension region 21b. For example, the portion where the first connecting body 81a is connected is used as a power supply terminal. The multiple band-like portions are connected at the end portion on the side opposite to the power supply terminal. A memory region MR that includes the semiconductor bodies 50 (the first pillar-shaped structure body MP1, etc.) is provided between the power supply terminal and the end portion connection region crx1.

For example, the position in the X-axis direction of the first semiconductor body 50A is between the position in the X-axis direction of the first connection region cr1 and the position in the X-axis direction of the end portion connection region crx1.

In the semiconductor memory device 112, the multiple band-like portions are connected to each other at a position distal to the power supply terminal. Thereby, for example, the resistance of the band-like portions (e.g., the word lines) can be lower. For example, operations that have high reliability are obtained.

Second Embodiment

FIG. 4 to FIG. 10 are schematic views illustrating a semiconductor memory device according to a second embodiment.

Figure 4:
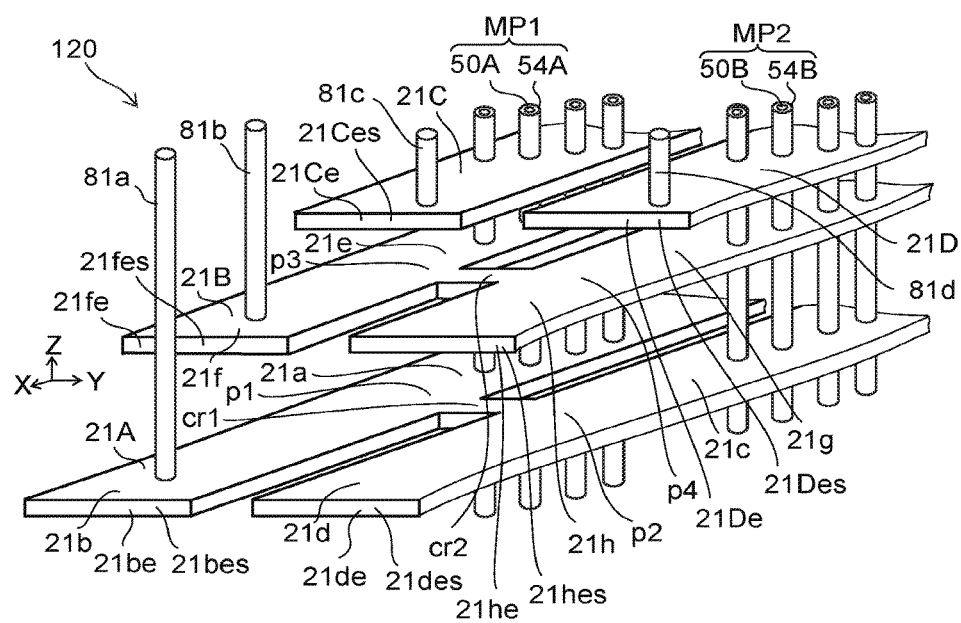
FIG. 4 is schematic views illustrating a semiconductor memory device according to a second embodiment.

FIG. 4 is a perspective view. FIG. 5A to FIG. 5D are plan views. FIG. 6 to FIG. 10 are cross-sectional views corresponding respectively to line A1-A2, line B1-B2, line C1-C2, line D1-D2, and line E1-E1 of FIG. 5A.

The semiconductor memory device 120 shown in these drawings further includes a second conductive layer 21B, a third conductive layer 21C, and a fourth conductive layer 21D in addition to the first conductive layer 21A, the first semiconductor body 50A, the second semiconductor body 50B, the first memory layer 54A, and the second memory layer 54B described above.

For example, the second conductive layer 21B functions as another word line. For example, the third conductive layer 21C and the fourth conductive layer 21D function as drain-side selection gates. In these drawings, two band-like portions are drawn to simplify the drawings. Similarly to the semiconductor memory device 110, three or more (e.g., four) band-like portions may be provided in the semiconductor memory device 120. Other than the description recited below, the configuration described in reference to the semiconductor memory device 110 is applicable.

In the semiconductor memory device 120 as shown in FIG. 4, at least a portion of the second conductive layer 21B overlaps at least a portion of the first conductive layer 21A in the Z-axis direction. The second conductive layer 21B includes fifth to eighth extension regions 21e to 21h and a second connection region cr2.

The fifth extension region 21e is separated from the first extension region 21a in the Z-axis direction. The fifth extension region 21e extends in the X-axis direction.

The sixth extension region 21f is separated from a portion of the second extension region 21b in the Z-axis direction and is arranged with the fifth extension region 21e in the X-axis direction. The sixth extension region 21f extends in the X-axis direction.

The seventh extension region 21g is separated from the third extension region 21c in the Z-axis direction and is arranged with the fifth extension region 21e in the Y-axis direction. The seventh extension region 21g extends in the X-axis direction.

The eighth extension region 21h is separated from a portion of the fourth extension region 21d in the Z-axis direction, is arranged with the seventh extension region 21g in the X-axis direction, and is arranged with the sixth extension region 21f in the Y-axis direction. The eighth extension region 21h extends in the X-axis direction.

The third connection region cr2 is connected to a portion p3 between the fifth extension region 21e and the sixth extension region 21f and to a portion p4 between the seventh extension region 21g and the eighth extension region 21h.

In other words, in the second conductive layer 21B, one band-like portion that includes the fifth extension region 21e and the sixth extension region 21f and one other band-like portion that includes the seventh extension region 21g and the eighth extension region 21h are connected by the second connection region cr2. The second connection region cr2 extends in the Y-axis direction.

The first semiconductor body 50A further extends through the fifth extension region 21e along the Z-axis direction. The second semiconductor body 50B further extends through the seventh extension region 21g along the Z-axis direction.

In the second conductive layer 21B of the semiconductor memory device 120, for example, the number of connecting bodies (contact electrodes) provided in the second conductive layer 21B can be low by connecting the multiple band-like portions to each other. Thereby, for example, the surface area of the connection region CR can be reduced.

Figure 5A:
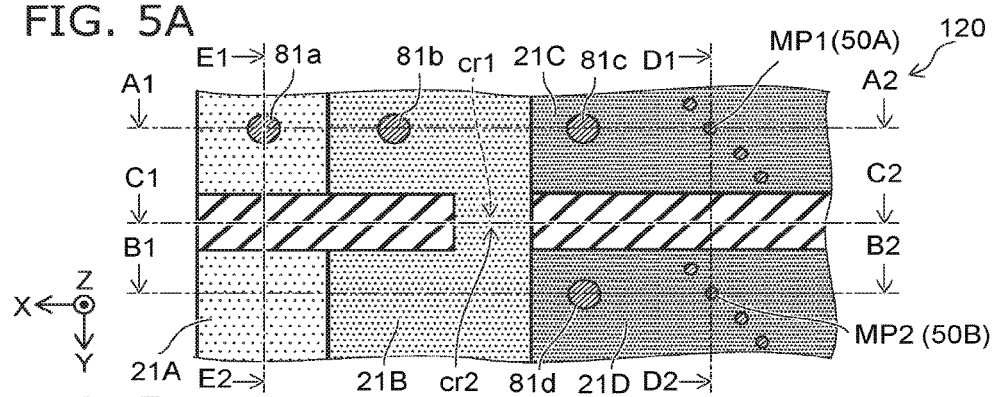
FIG. 5A to FIG. 5D are schematic views illustrating a semiconductor memory device according to a second embodiment.
Figure 5B:
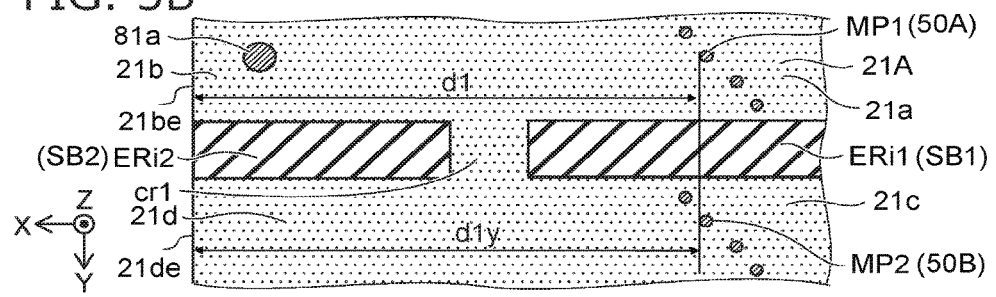
Figure 5C:
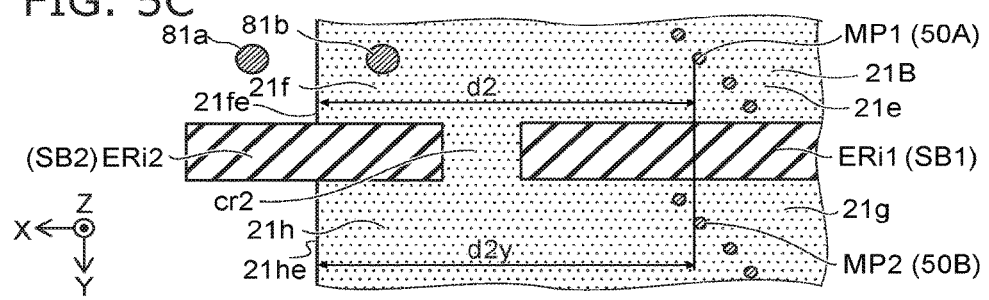
Figure 5D:
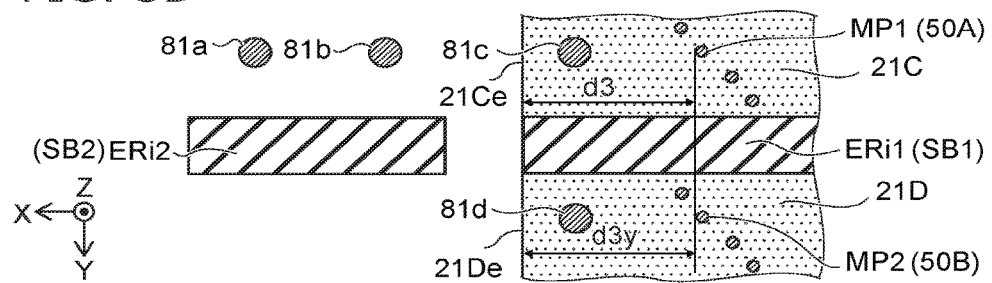

FIG. 5A illustrates the state in which the first to fourth conductive layers 21A to 21D overlap. FIG. 5B is a plan view of the X-Y plane including the first conductive layer 21A. FIG. 5C is a plan view of the X-Y plane including the second conductive layer 21B. FIG. 5D is a plan view of the X-Y plane including the third conductive layer 21C and the fourth conductive layer 21D.

In the semiconductor memory device 120, for example, the first structure body SB1 may extend between the fifth extension region 21e and the seventh extension region 21g (referring to FIG. 5C). The second structure body SB2 may extend between the sixth extension region 21f and the eighth extension region 21h (referring to FIG. 5C).

In the semiconductor memory device 120, for example, at least a portion of the second connection region cr2 overlaps at least a portion of the first connection region cr1 in the Z-axis direction (referring to FIG. 4, FIG. 5B, and FIG. 5C).

As shown in FIG. 4, for example, the second conductive layer 21B is provided on the first conductive layer 21A. The end portion of the second conductive layer 21B on the upper side is proximal to the semiconductor body 50 compared to the first conductive layer 21A on the lower side. For example, the end portions of the first conductive layer 21A and the second conductive layer 21B have a staircase configuration.

For example, in the first conductive layer 21A as shown in FIG. 4, the second extension region 21*b* includes a second extension region end portion 21*be*. The second extension region end portion 21*be* has a side surface 21*bes* crossing the X-axis direction. In the second conductive layer 21B, the sixth extension region 21*f* includes a sixth extension region end portion 21*fe*. The sixth extension region end portion 21*fe* has a side surface 21*fes* crossing the X-axis direction.

As shown in FIG. 5B, a first distance d1 is the distance between the second extension region end portion 21*be* and the first semiconductor body 50A. As shown in FIG. 5C, a second distance d2 is the distance between the sixth extension region end portion 21*fe* and the first semiconductor body 50A. The first distance d1 is longer than the second distance d2.

Similarly, in the first conductive layer 21A as shown in FIG. 4, the fourth extension region 21*d* includes a fourth extension region end portion 21*de*. The fourth extension region end portion 21*de* has a side surface 21*des* crossing the X-axis direction. For example, a distance d1*y* is the distance in the X-axis direction between the position in the X-axis direction of the fourth extension region end portion 21*de* and the position in the X-axis direction of the first semiconductor body 50A (referring to FIG. 5B). In the example, for example, the distance d1*y* is substantially the same as the first distance d1. The distance d1*y* is, for example, not less than 0.95 times and not more than 1.05 times the first distance d1.

In the second conductive layer 21B as shown in FIG. 4, the eighth extension region 21*h* includes an eighth extension region end portion 21*he*. The eighth extension region end portion 21*he* has a side surface 21*hes* crossing the X-axis direction. For example, a distance d2*y* is the distance in the X-axis direction between the position in the X-axis direction of the eighth extension region end portion 21*he* and the position in the X-axis direction of the first semiconductor body 50A (referring to FIG. 5C). In the example, for example, the distance d2*y* is substantially the same as the second distance d2. The distance d2*y* is, for example, not less than 0.95 times and not more than 1.05 times the second distance d2.

An example of the third conductive layer 21C and the fourth conductive layer 21D will now be described.

As shown in FIG. 4, the third conductive layer 21C is separated from a portion of the first extension region 21*a* in the Z-axis direction. The third conductive layer 21C extends in the X-axis direction. The fourth conductive layer 21D is separated from a portion of the third extension region 21*c* in the Z-axis direction. The fourth conductive layer 21D extends in the X-axis direction.

For example, a portion of the second conductive layer 21B is disposed between the third conductive layer 21C and a portion of the first conductive layer 21A. For example, a portion of the second conductive layer 21B is disposed between the fourth conductive layer 21D and a portion of the first conductive layer 21A.

For example, a portion of the fifth extension region 21*e* of the second conductive layer 21B is positioned between the third conductive layer 21C and a portion of the first extension region 21*a* of the first conductive layer 21A. A portion of the seventh extension region 21*g* of the second conductive layer 21B is positioned between the fourth conductive layer 21D and a portion of the third extension region 21*c* of the first conductive layer 21A.

The first semiconductor body 50A extends through the third conductive layer 21C along the Z-axis direction. The second semiconductor body 50B extends through the fourth conductive layer 21D along the Z-axis direction.

One selection transistor is formed at the portion where the third conductive layer 21C and the first semiconductor body 50A cross. One other selection transistor is formed at the portion where the fourth conductive layer 21D and the first semiconductor body 50A cross. The multiple semiconductor bodies 50 (i.e., the memory strings including the multiple memory cells MC) are selected according to the operations of these selection transistors.

As shown in FIG. 4 and FIG. 5A, for example, the positions in the X-axis direction of the end portions of the third conductive layer 21C and the fourth conductive layer 21D are between the position in the X-axis direction of the first connection region cr1 and the position in the X-axis direction of the first semiconductor body 50.

For example, the portion p1 between the first extension region 21*a* and the second extension region 21*b* recited above does not overlap the third conductive layer 21C in the Z-axis direction. The portion p2 between the third extension region 21*c* and the fourth extension region 21*d* recited above does not overlap the fourth conductive layer 21D in the Z-axis direction. For example, as shown in FIG. 4 and FIG. 5D, the third conductive layer 21C includes a third conductive layer end portion 21C*e*. The third conductive layer end portion 21C*e* has a side surface 21C*es* crossing the X-axis direction. The fourth conductive layer 21D includes a fourth conductive layer end portion 21D*e*. The fourth conductive layer end portion 21D*e* has a side surface 21D*es* crossing the X-axis direction.

For example, the first distance d1 between the first semiconductor body 50A and the second extension region end portion 21*be* of the second extension region 21*b* (referring to FIG. 5B) is longer than a third distance d3 between the third conductive layer end portion 21C*e* and the first semiconductor body 50A (referring to FIG. 5D).

For example, the distance d1*y* along the X-axis direction between the position in the X-axis direction of the fourth extension region end portion 21*de* of the fourth extension region 21*d* and the position in the X-axis direction of the first semiconductor body 50A (referring to FIG. 5B) is longer than a distance dy3 along the X-axis direction between the position in the X-axis direction of the fourth conductive layer end portion 21D*e* and the position in the X-axis direction of the first semiconductor body 50A (referring to FIG. 5D).

As shown in FIG. 5A and FIG. 5C, for example, the first structure body SB1 extends between the fifth extension region 21*e* and the seventh extension region 21*g*. For example, the second structure body SB2 extends between the sixth extension region 21*f* and the eighth extension region 21*h*.

As shown in FIG. 5D, the first structure body SB1 extends between the third conductive layer 21C and the fourth conductive layer 21D.

As shown in FIG. 4, FIG. 5A, FIG. 6, and FIG. 7, the first to fourth connecting bodies 81*a* to 81*d* (e.g., the contact electrodes) are provided. These connecting bodies extend in the Z-axis direction.

In the example, the first connecting body 81*a* overlaps the second extension region 21*b* in the Z-axis direction and is electrically connected to the second extension region 21*b*.

The second connecting body 81b overlaps the sixth extension region 21f in the Z-axis direction and is electrically connected to the sixth extension region 21f. The third connecting body 81c overlaps the third conductive layer 21C in the Z-axis direction and is electrically connected to the third conductive layer 21C. The fourth connecting body 81d overlaps the fourth conductive layer 21D in the Z-axis direction and is electrically connected to the fourth conductive layer 21D.

Figure 6:
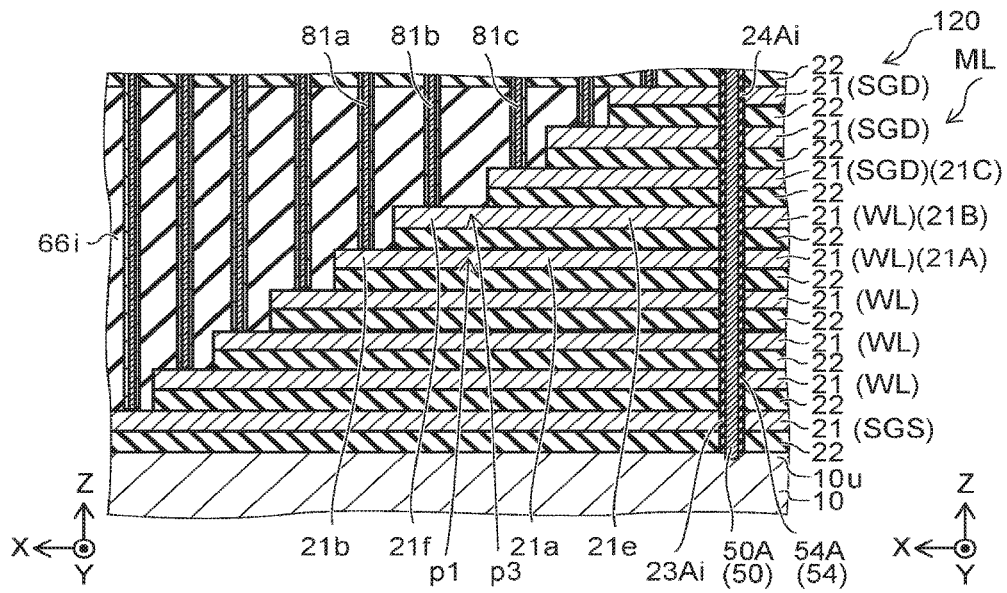
FIG. 6 is schematic views illustrating a semiconductor memory device according to a second embodiment.

In the semiconductor memory device 120 as shown in FIG. 6, a stacked body ML is provided on a base semiconductor layer 10 (e.g., at least a portion of a semiconductor substrate). The stacked body ML includes multiple conductive layers 21 and multiple insulating layers 22 that are arranged alternately. The stacking direction corresponds to the Z-axis direction. The Z-axis direction is substantially perpendicular to an upper surface 10u of the base semiconductor layer 10.

Several of the multiple conductive layers 21 are used as word lines WL. One of the word lines WL corresponds to the first conductive layer 21A. One other of the word lines WL corresponds to the second conductive layer 21B. One or a plurality of the multiple conductive layers 21 corresponds to a drain-side selection gate SGD. The multiple drain-side selection gates SGD are provided in the example. One other of the multiple conductive layers 21 corresponds to a source-side selection gate SGS.

For example, an insulating layer 23Ai (a gate insulating film) is provided between the first semiconductor body 50A and the source-side selection gate SGS. An insulating layer 24Ai (a gate insulating film) is provided between the first semiconductor body 50A and the drain-side selection gates SGD (e.g., the third conductive layer 21C).

The end portions of the multiple conductive layers 21 have a staircase configuration. Connecting bodies (e.g., the first to third connecting bodies 81a to 81c, etc.) are provided at the portions having the staircase configuration.

Figure 7:
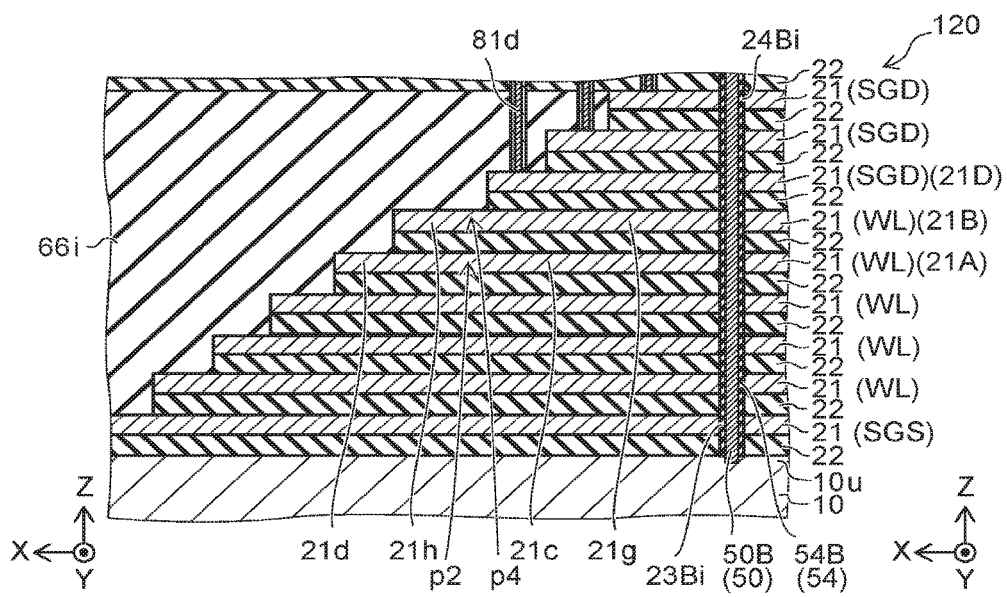
FIG. 7 is schematic views illustrating a semiconductor memory device according to a second embodiment.

As shown in FIG. 7, an insulating layer 23Bi (a gate insulating film) is provided between the second semiconductor body 50B and the source-side selection gate SGS. An insulating layer 24Bi (a gate insulating film) is provided between the second semiconductor body 50B and the drain-side selection gates SGD (e.g., the fourth conductive layer 21D).

The end portions of the multiple conductive layers 21 have a staircase configuration. Connecting bodies (e.g., the fourth connecting body 81d, etc.) are provided at the portions having the staircase configuration.

Figure 8:
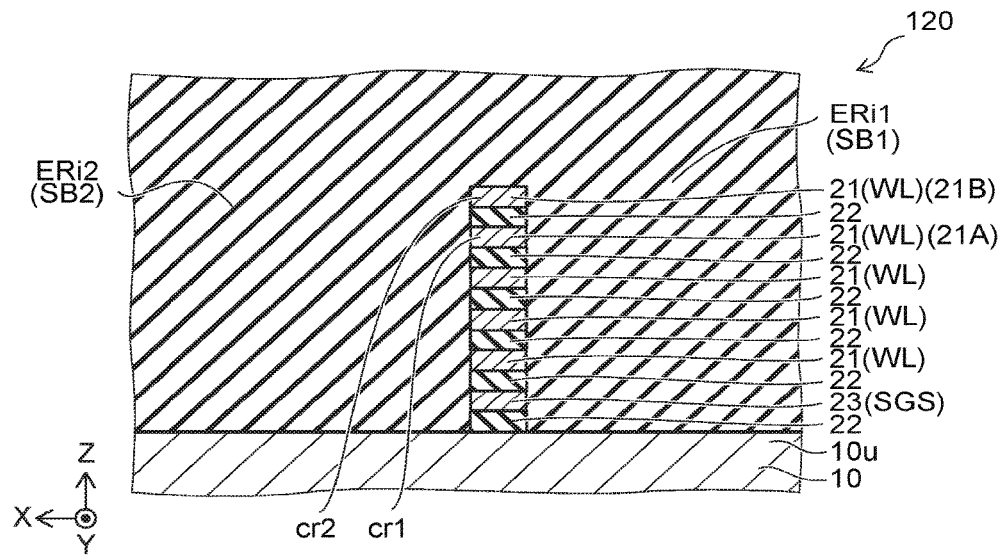
FIG. 8 is schematic views illustrating a semiconductor memory device according to a second embodiment.

As shown in FIG. 8, a portion of the insulating layers 22 is provided between the first connection region cr1 and the second connection region cr2.

Figure 9:
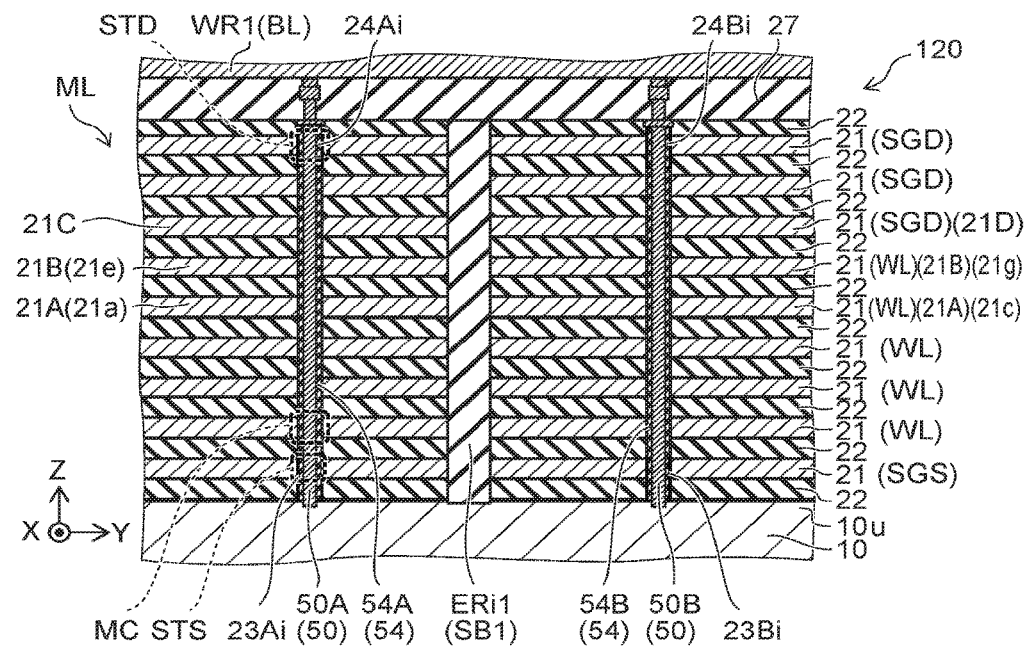
FIG. 9 is schematic views illustrating a semiconductor memory device according to a second embodiment.

As shown in FIG. 9, a source-side selection transistor STS is formed at the portion where the first semiconductor body 50A and the source-side selection gate SGS (the conductive layer 21) cross. Drain-side selection transistors STD are formed at the portions where the first semiconductor body 50A and the drain-side selection gates SGD (the conductive layers 21) cross. Another source-side selection transistor STS is formed at the portion where the second semiconductor body 50B and the source-side selection gate SGS (the conductive layer 21) cross. Other drain-side selection transistors STD are formed at the portions where the second semiconductor body 50B and the drain-side selection gates SGD (the conductive layers 21) cross.

The memory cells MC are formed at the portions where the first semiconductor body 50A and the second semiconductor body 50B cross the word lines WL (the conductive layers 21). An end of the first semiconductor body 50A is connected to the base semiconductor layer 10; and the other end is connected to a first interconnect WR1 (e.g., a bit line BL). An end of the second semiconductor body 50B is connected to the base semiconductor layer 10; and the other end is connected to the first interconnect WR1. One of the multiple semiconductor bodies 50 is selected by the operations of the selection transistors; and the operations of the programming, erasing, and reading are performed.

Figure 10:
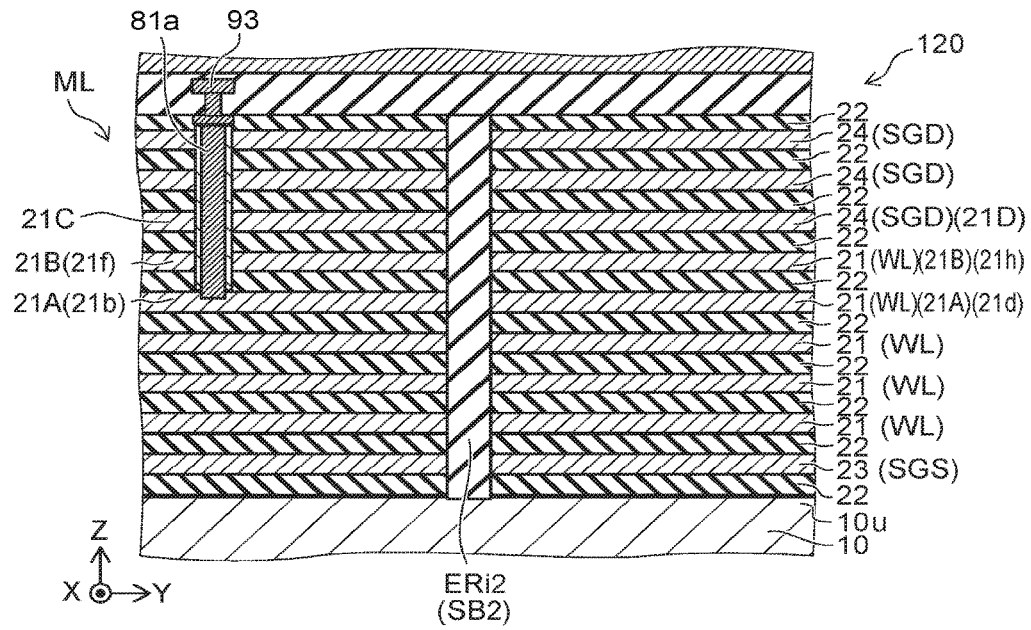
FIG. 10 is schematic views illustrating a semiconductor memory device according to a second embodiment.

In the semiconductor memory device 120 as shown in FIG. 10, the first connecting body 81a is electrically connected to an interconnect 93.

Figure 11:
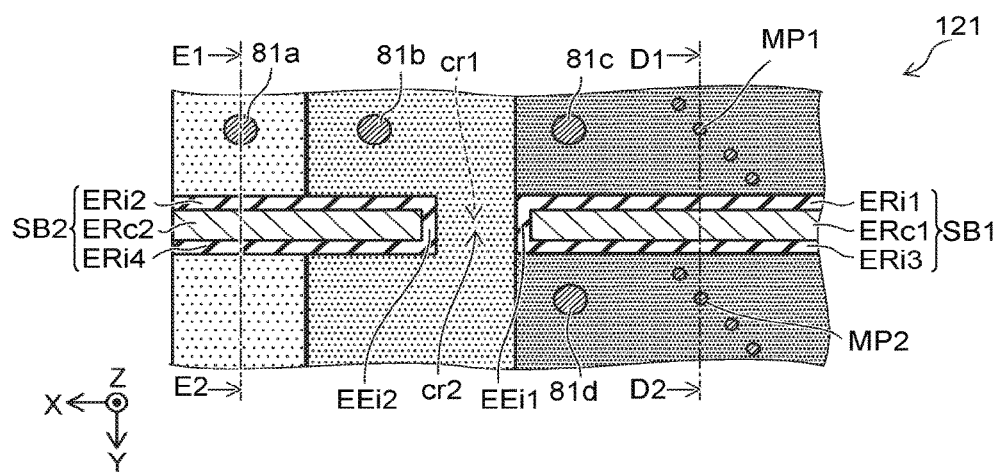
FIG. 11 is schematic views illustrating another semiconductor memory device according to the second embodiment.
Figure 12:
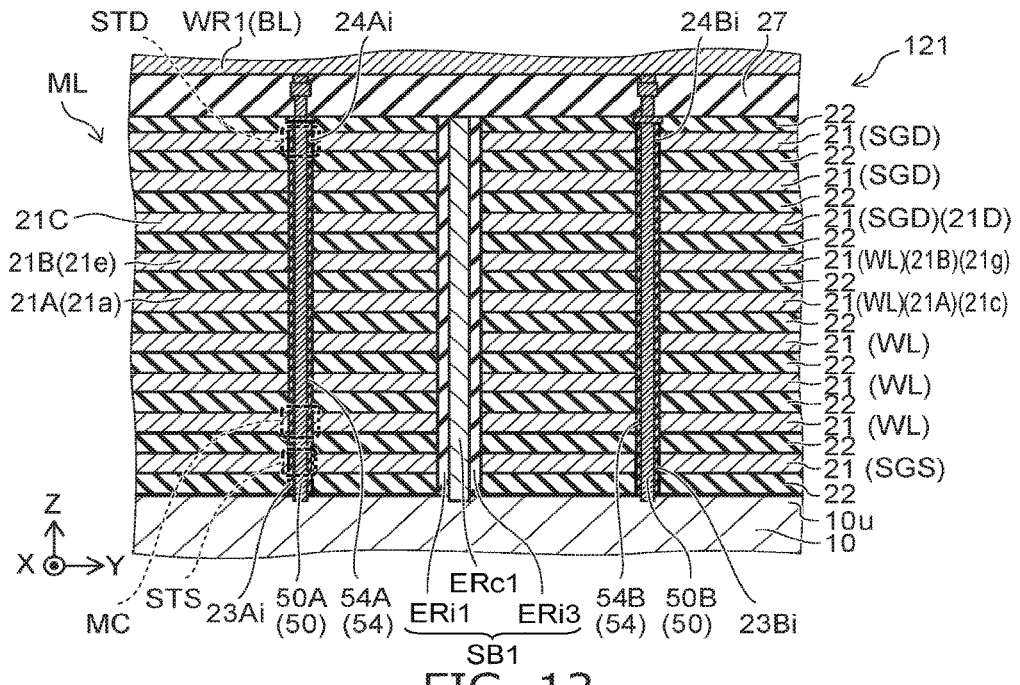
FIG. 12 is schematic views illustrating another semiconductor memory device according to the second embodiment.
Figure 13:
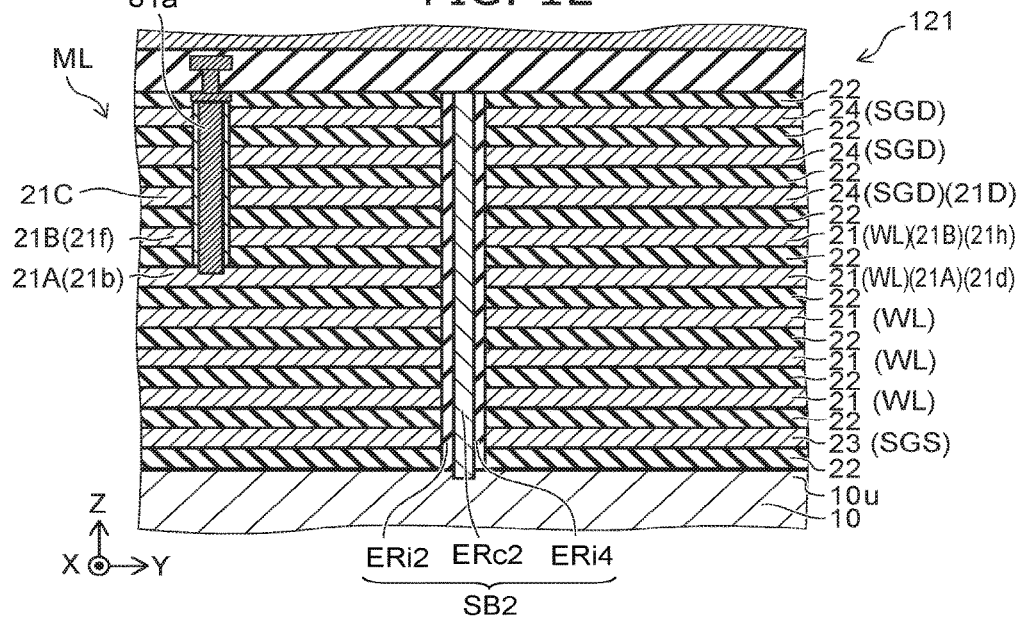
FIG. 13 is schematic views illustrating another semiconductor memory device according to the second embodiment.

FIG. 11 to FIG. 13 are schematic views illustrating another semiconductor memory device according to the second embodiment.

FIG. 11 is a plan view. FIG. 12 is a line D1-D2 cross-sectional view of FIG. 11. FIG. 13 is a line E1-E1 cross-sectional view of FIG. 11.

In the semiconductor memory device 121 shown in these drawings, the first structure body SB1 and the second structure body SB2 each include conductive layers. In other words, the first structure body SB1 and the second structure body SB2 of the semiconductor memory device 120 have the structures of the first structure body SB1 and the second structure body SB2 described in reference to FIG. 2. Otherwise, the semiconductor memory device 121 is similar to the semiconductor memory device 120; and a description is therefore omitted.

For example, in the first structure body SB1, the first extension insulating region ERi1 is further provided between the fifth extension region 21e and the seventh extension region 21g. The third extension insulating region ERi3 is further provided between the first extension insulating region ERi1 and the seventh extension region 21g. Between the fifth extension region 21e and the seventh extension region 21g, the first extension conductive layer ERc1 is provided between the first extension insulating region ERi1 and the third extension insulating region ERi3.

For example, in the second structure body SB2, a portion of the second extension insulating region ERi2 is further provided between the sixth extension region 21f and the eighth extension region 21h. The fourth extension insulating region ERi4 is further provided between the second extension insulating region ERi2 and the eighth extension region 21h. Between the sixth extension region 21f and the eighth extension region 21h, the second extension conductive layer ERc2 is provided between the second extension insulating region ERi2 and the fourth extension insulating region ERi4.

For example, the first connection region-side insulating region EEi1 of the first structure body SB1 is further provided between the first extension conductive layer ERc1 and the second connection region cr2. The second connection region-side insulating region EEi2 of the second structure body SB2 is further provided between the second extension conductive layer ERc2 and the second connection region cr2.

Figure 14:
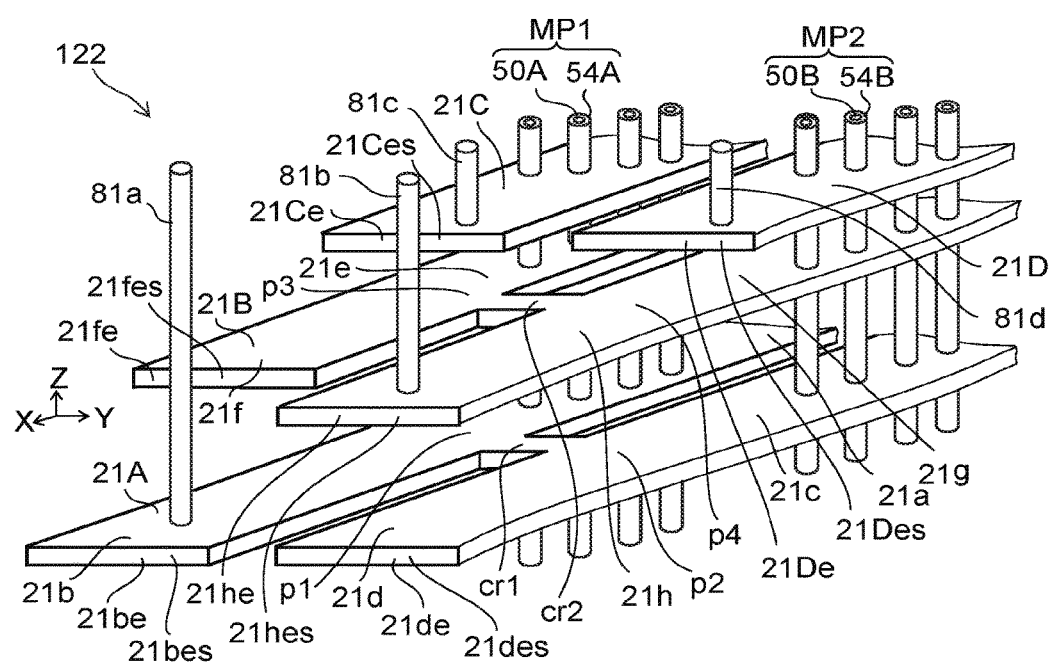
FIG. 14 is schematic views illustrating another semiconductor memory device according to the second embodiment.

FIG. 14 and FIG. 15 are schematic views illustrating another semiconductor memory device according to the second embodiment.

FIG. 14 is a perspective view. FIG. 15A to FIG. 15D are plan views. The first to fourth conductive layers 21A to 21D are provided in the example as well.

Figure 15A:
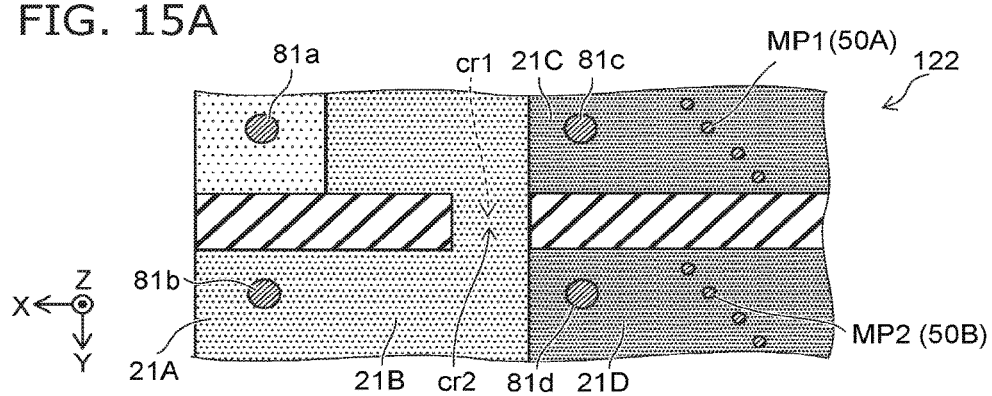
FIG. 15A to FIG. 15D are schematic views illustrating another semiconductor memory device according to the second embodiment.
Figure 15B:
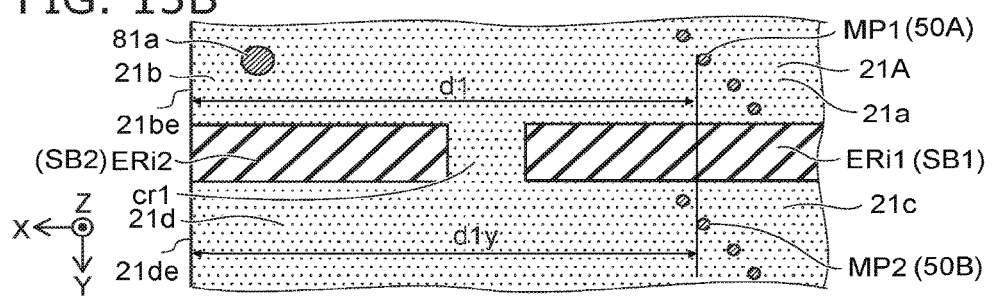
Figure 15C:
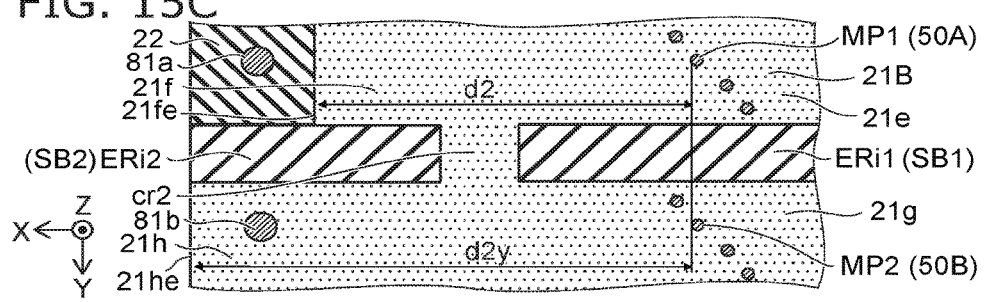
Figure 15D:
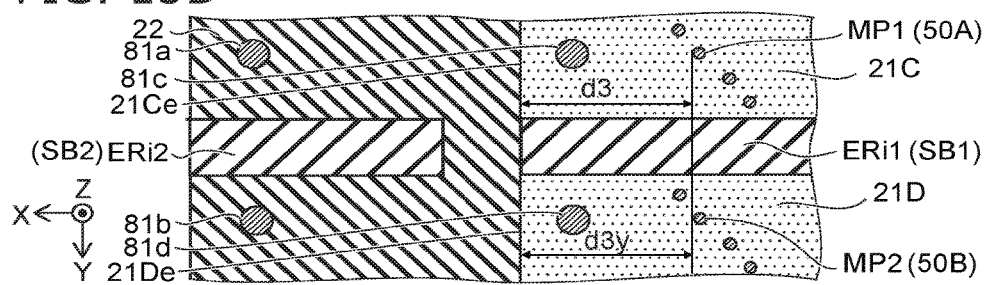

FIG. 15A illustrates the state in which the first to fourth conductive layers 21A to 21D overlap. FIG. 15B is a plan view of the X-Y plane including the first conductive layer 21A. FIG. 15C is a plan view of the X-Y plane including the second conductive layer 21B. FIG. 15D is a plan view of the X-Y plane including the third conductive layer 21C and the fourth conductive layer 21D.

In the semiconductor memory device 122, the lengths of the multiple extension regions (the sixth extension region 21f and the eighth extension region 21h) included in the second conductive layer 21B are different from each other.

As shown in FIG. 14, for example, the sixth extension region 21f includes the sixth extension region end portion 21fe having the side surface 21fes crossing the X-axis direction. The eighth extension region 21h includes the eighth extension region end portion 21he having the side surface 21hes crossing the X-axis direction.

As shown in FIG. 15C, the second distance d2 is the distance between the sixth extension region end portion 21fe and the first semiconductor body 50A. On the other hand, a distance dy2 is the distance in the X-axis direction between the position in the X-axis direction of the eighth extension region end portion 21he and the position in the X-axis direction of the first semiconductor body 50A. The second distance d2 is shorter than the distance dy2.

Thus, the distances between the semiconductor body 50 and the end portions of the multiple extension regions inside one conductive layer 21 are different from each other. A connecting body is provided at one of such multiple end portions.

For example, the first connecting body 81a is provided as shown in FIG. 14 and FIG. 15B. The first connecting body 81a extends in the Z-axis direction. The first connecting body 81a is electrically connected to the second extension region 21b of the first conductive layer 21A. In this case, the second extension region 21b includes the second extension region end portion 21be having the side surface 21bes crossing the X-axis direction. The position in the X-axis direction of the first connecting body 81a is between the position in the X-axis direction of the second extension region end portion 21be and the position in the X-axis direction of the first semiconductor body 50A. On the other hand, the sixth extension region 21f includes the sixth extension region end portion 21fe having the side surface 21fes crossing the X-axis direction. The position in the X-axis direction of the sixth extension region end portion 21fe is between the position in the X-axis direction of the first connecting body 81a and the position in the X-axis direction of the first semiconductor body 50A.

The second connecting body 81b is further provided as shown in FIG. 14 and FIG. 15C. The second connecting body 81b extends in the Z-axis direction and is electrically connected to the eighth extension region 21h. As described above, the sixth extension region 21f includes the sixth extension region end portion 21fe having the side surface 21fes crossing the X-axis direction. The position in the X-axis direction of the sixth extension region end portion 21fe is between the position in the X-axis direction of the second connecting body 81b and the position in the X-axis direction of the first semiconductor body 50A. For example, in the second conductive layer 21B, the second connecting body 81b is provided at a long extension region.

In the semiconductor memory device 122, the multiple band-like portions that are included in the second conductive layer 21B are connected by the connection region CR2. Therefore, by providing the connecting body for at least one of the multiple band-like portions, the connecting body and the multiple band-like portions are electrically connected. Thereby, the surface area of the connection region CR for providing the connecting bodies can be reduced.

FIG. 16, FIG. 17A to FIG. 17H, FIG. 18A to FIG. 18H, FIG. 19A to FIG. 19H, and FIG. 20A to FIG. 20C are schematic plan views illustrating another semiconductor memory device according to the second embodiment.

Figure 16:
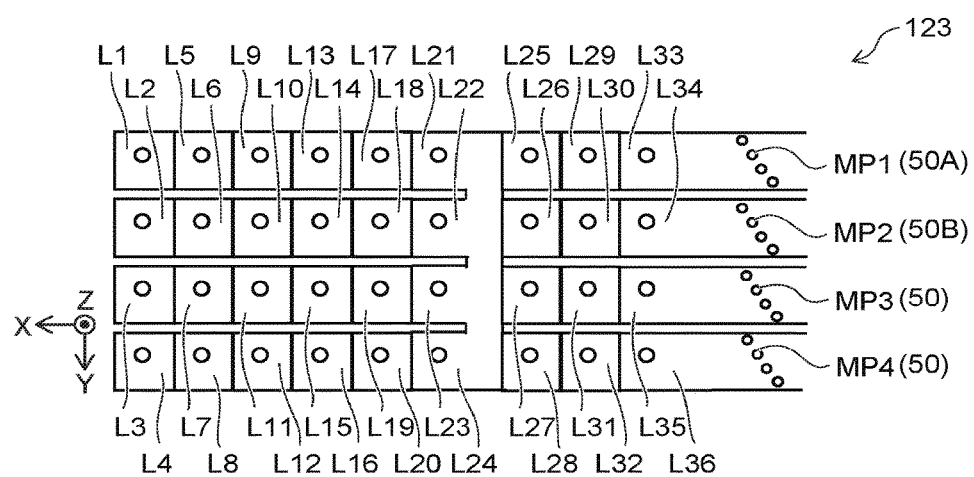
FIG. 16 is schematic plan views illustrating another semiconductor memory device according to the second embodiment.
Figure 17A:
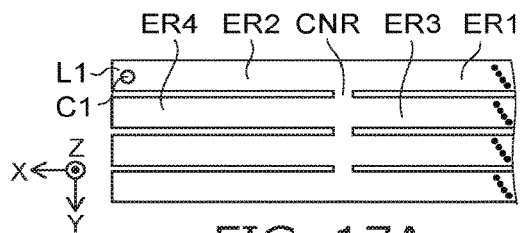
FIG. 17A to FIG. 17H are schematic plan views illustrating another semiconductor memory device according to the second embodiment.
Figure 17E:
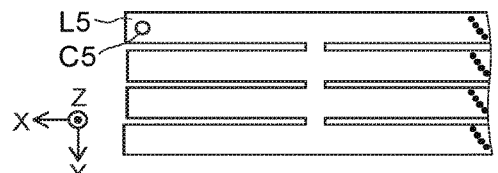
Figure 17B:
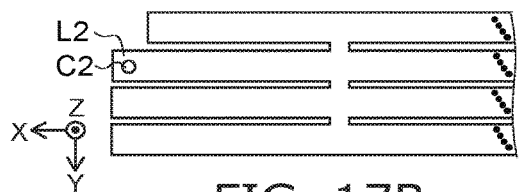
Figure 17F:
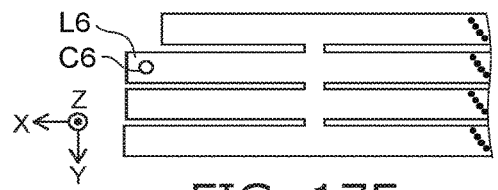
Figure 17C:
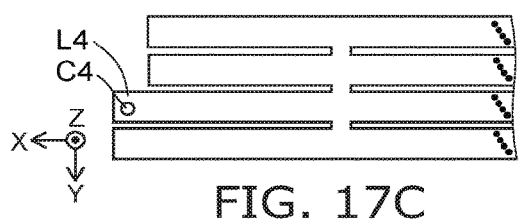
Figure 17G:
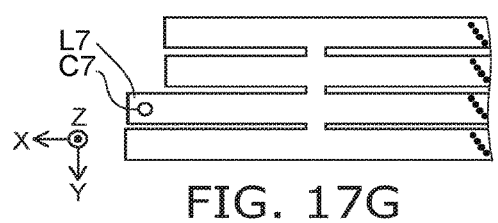
Figure 17D:
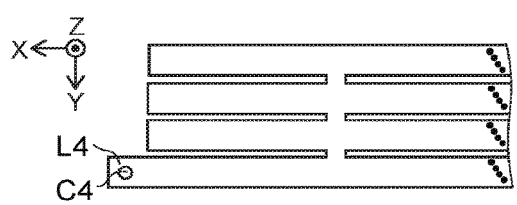
Figure 17H:
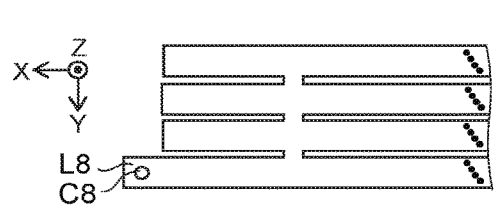
Figure 18A:
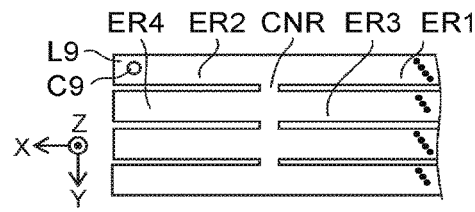
FIG. 18A to FIG. 18H are schematic plan views illustrating another semiconductor memory device according to the second embodiment.
Figure 18E:
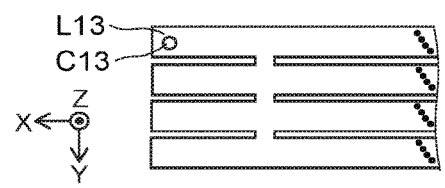
Figure 18B:
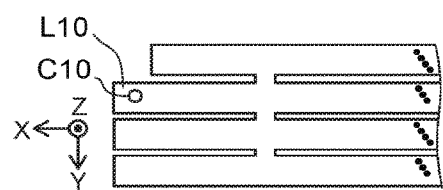
Figure 18F:
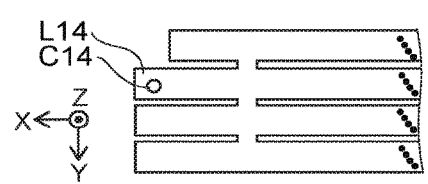
Figure 18C:
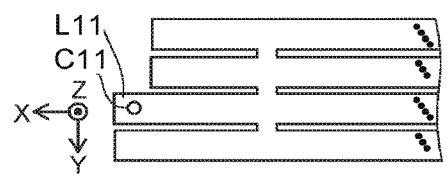
Figure 18G:
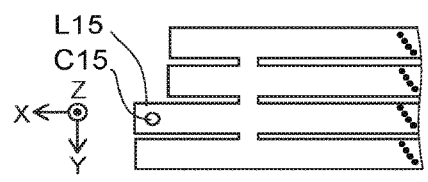
Figure 18D:
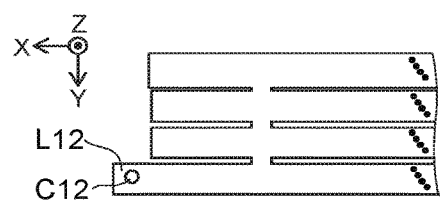
Figure 18H:
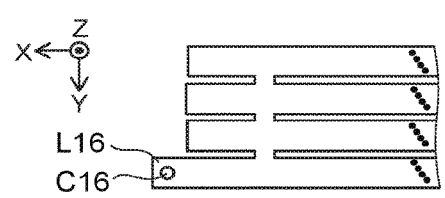

As shown in FIG. 16, multiple conductive layers (conductive first to thirty-second layers L1 to L32) are provided in the other semiconductor memory device 123 according to the embodiment. FIG. 17A to FIG. 17H, FIG. 18A to FIG. 18H, FIG. 19A to FIG. 19H, and FIG. 20A to FIG. 20C illustrate each of the multiple conductive layers.

First to fourth extension regions ER1 to ER4 (referring to FIG. 17A) are provided in each of the conductive layers. Two band-like portions are connected partway through the band-like portions by a connection region CNR. As shown in FIG. 17A to FIG. 17H, FIG. 18A to FIG. 18H, FIG. 19A to FIG. 19H, and FIG. 20A to FIG. 20C, the positions of the end portions of the multiple extension regions are different from each other between the first to thirty-second layers L1 to L32. The connecting bodies (first to thirty-second connecting bodies C1 to C32) that extend in the Z-axis direction are connected respectively to the first to thirty-second layers L1 to L32.

In the semiconductor memory device 123, the surface area of the connection region CR for providing the connecting bodies can be reduced.

Figure 21A:
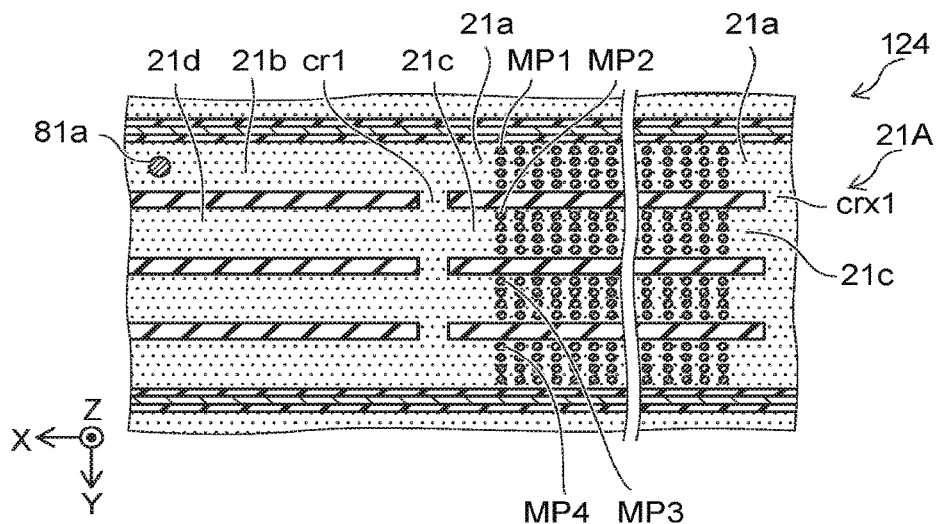
FIG. 21A and FIG. 21B are schematic plan views illustrating another semiconductor memory device according to the second embodiment.
Figure 21B:
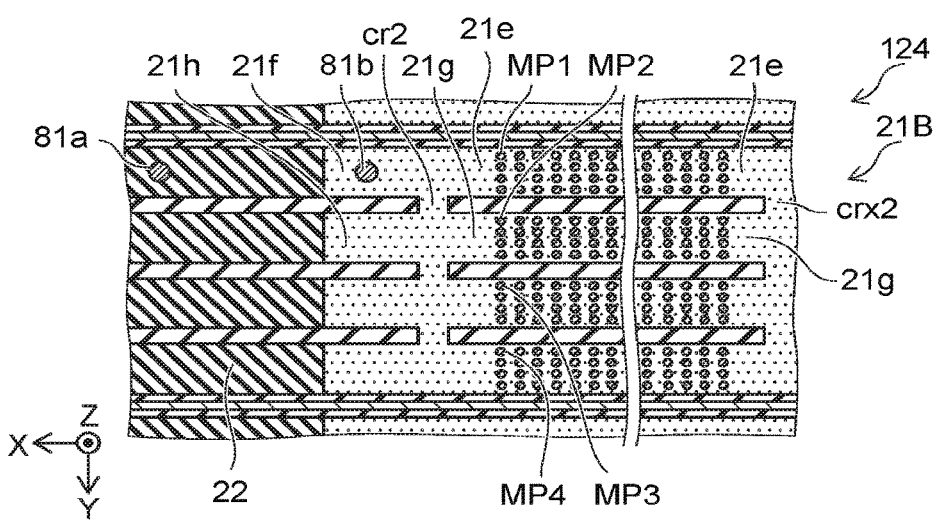

FIG. 21A and FIG. 21B are schematic plan views illustrating another semiconductor memory device according to the second embodiment.

In the other semiconductor memory device 124 according to the embodiment, the multiple band-like portions are connected to each other by the first connection region cr1, the second connection region, etc. Further, the multiple band-like portions are connected to each other at other positions (other end portions). Otherwise, the semiconductor memory device 124 is similar to the semiconductor memory device 120; and a description is therefore omitted.

Figure 19A:
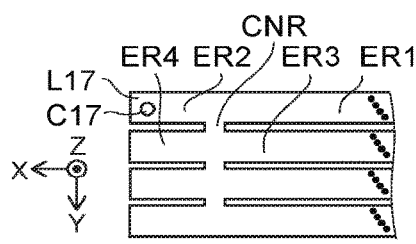
FIG. 19A to FIG. 19H are schematic plan views illustrating another semiconductor memory device according to the second embodiment.
Figure 19E:
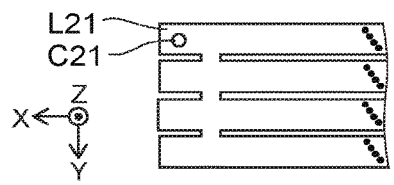

As shown in FIG. 19A, for example, the first conductive layer 21A further includes the end portion connection region crx1 described above. The end portion connection region crx1 is connected to the first extension region 21a and the third extension region 21c.

Figure 19B:
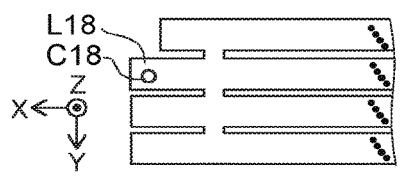
Figure 19F:
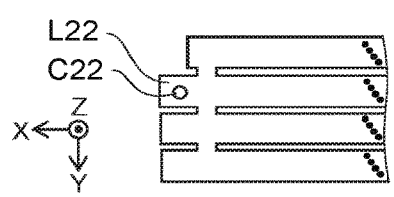
Figure 19C:
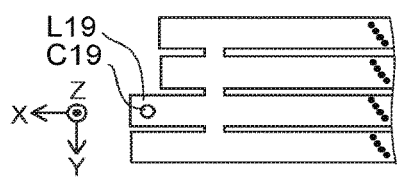
Figure 19G:
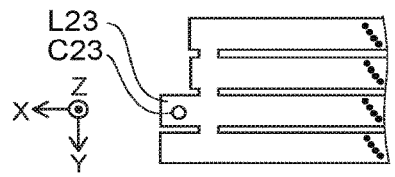
Figure 19D:
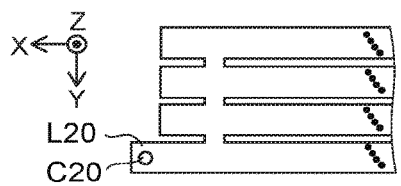
Figure 19H:
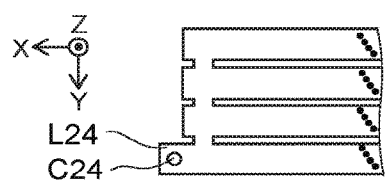
Figure 20A:
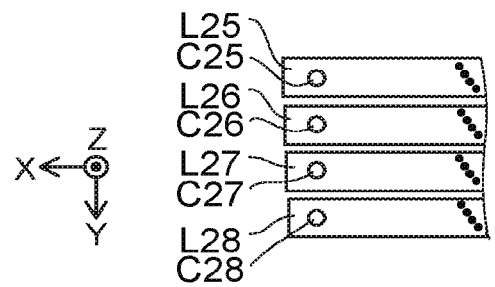
FIG. 20A to FIG. 20C are schematic plan views illustrating another semiconductor memory device according to the second embodiment.
Figure 20B:
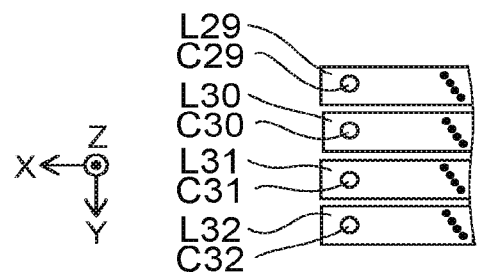
Figure 20C:
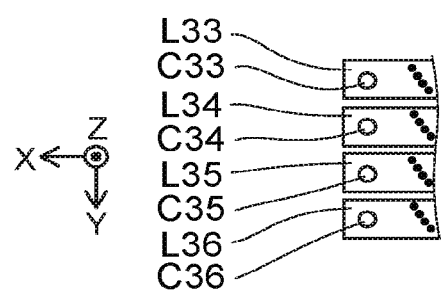

As shown in FIG. 19B, for example, the second conductive layer 21B further includes an end portion connection region crx2. The end portion connection region crx2 is connected to the fifth extension region 21e and the seventh extension region 21g.

For example, the position in the X-axis direction of the first semiconductor body 50A is between the position in the X-axis direction of the second connection region cr2 and the position in the X-axis direction of the end portion connection region crx2.

In the semiconductor memory device 124, the multiple band-like portions are connected to each other at a position distal to the power supply terminal. Thereby, for example, the resistance of the band-like portions (e.g., the word line) can be lower. Operations that have high reliability are obtained.

Figure 22:
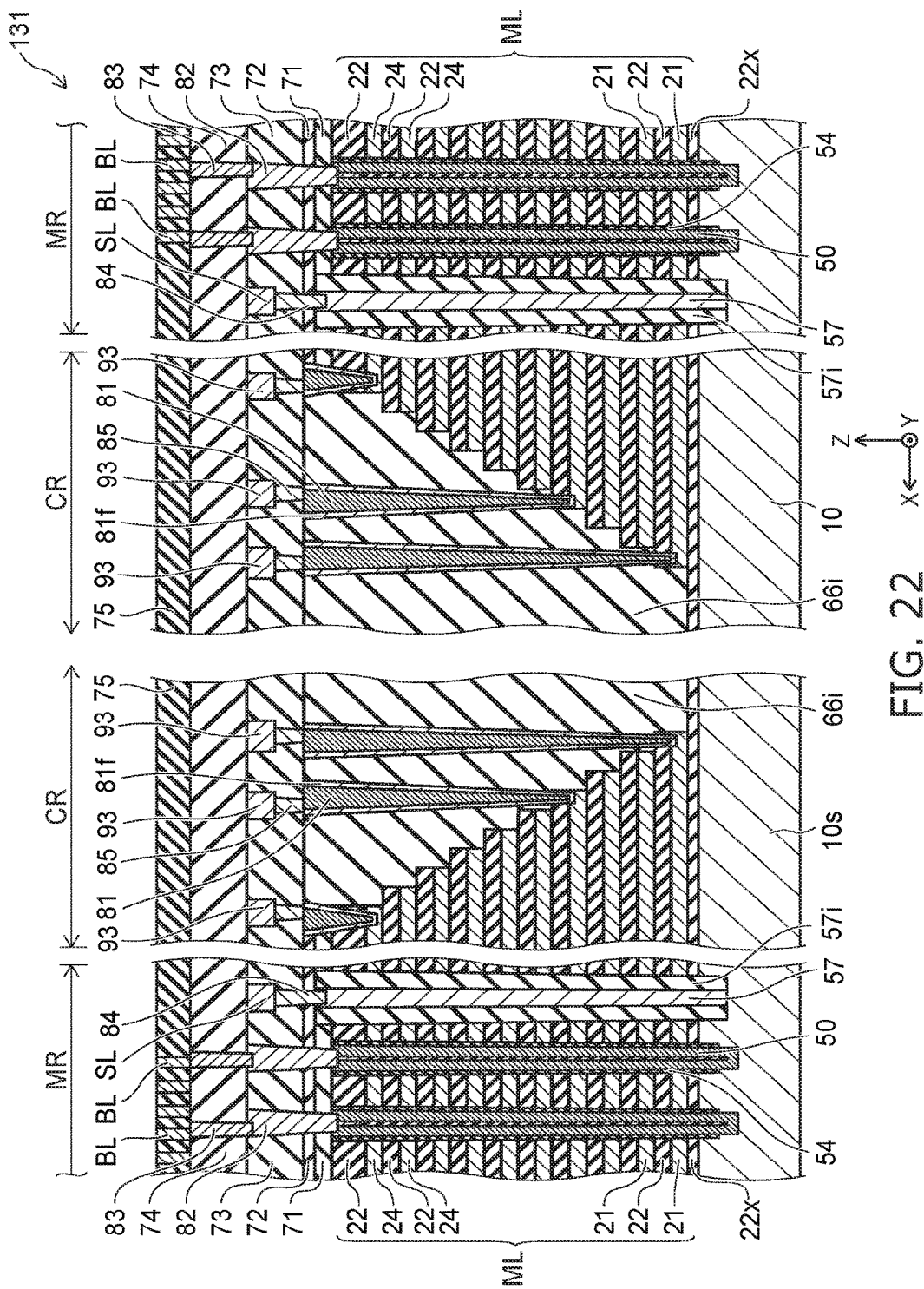
FIG. 22 is a schematic cross-sectional view illustrating the semiconductor memory device according to the embodiment.

FIG. 22 is a schematic cross-sectional view illustrating the semiconductor memory device according to the embodiment.

FIG. 22 illustrates the memory region MR and the connection region CR of the semiconductor memory device according to the embodiment.

As shown in FIG. 22, the base semiconductor layer 10 (e.g., the semiconductor substrate) is provided in the semiconductor memory device 131 according to the embodiment. In the example, an insulating layer 22x is provided on the base semiconductor layer 10.

In the memory region MR, the stacked body ML is provided on the insulating layer 22x. Also, the semiconductor body 50, the memory layer 54, and a conductive portion 57 are provided. The conductive portion 57 is used as a source member. In the stacked body ML, the multiple conductive layers 21 are provided; and the insulating layers 22 are provided between the multiple conductive layers 21. A portion of the conductive layers 21 is used as the source-side selection gate SGS (e.g., the lower selection gate). A portion of the conductive layers 21 is used as the drain-side selection gate SGD (e.g., the upper selection gate). The memory layer 54 is provided between the stacked body ML and the semiconductor body 50.

The semiconductor body 50 is electrically connected to the base semiconductor layer 10. The conductive portion 57 extends through the stacked body ML in the Z-axis direction. The conductive portion 57 may spread along the Z-X plane. The semiconductor body 50 and the conductive portion 57 are electrically connected via the base semiconductor layer 10.

The conductive portion 57 includes a metal (e.g., tungsten, etc.). The conductive portion 57 may include, for example, a semiconductor (polysilicon including an impurity, etc.). An insulating film 57i is provided between the conductive portion 57 and the stacked body ML.

An insulating film 71 is provided on the stacked body ML. An insulating film 72 is provided on the insulating film 71. An insulating film 73 is provided on the insulating film 72. An insulating film 74 is provided on the insulating film 73. An insulating film 75 is provided on the insulating film 74.

In the connection region CR, the end portions of the multiple conductive layers 21 have a staircase configuration. A connecting body 81 (e.g., a contact plug) is provided on each of the multiple conductive layers 21. For example, the connecting body 81 has a columnar configuration extending in the Z-axis direction. The connecting body 81 is electrically connected to one of the multiple conductive layers 21. The connecting body 81 includes a conductive material (e.g., tungsten, etc.). An insulating portion 66i is provided at the periphery of the connecting body 81.

A barrier metal film 81f is provided between the connecting body 81 and the insulating portion 66i. The barrier metal film 81f is provided also between the connecting body 81 and the conductive layer 21 electrically connected to the connecting body 81. The barrier metal film 81f is a film including a metal. The barrier metal film 81f includes, for example, titanium. The barrier metal film 81f may be a film including titanium nitride.

In the memory region MR, a connecting body 82 is provided on the semiconductor body 50. A connecting body 83 is provided on the connecting body 82. For example, the multiple bit lines BL that extend in the Y-axis direction are provided on the connecting body 83. The semiconductor body 50 and one of the multiple bit lines BL are electrically connected via the connecting bodies 82 and 83.

A connecting body 84 is provided on the conductive portion 57. A source line SL that extends in the Y-axis direction is provided on the connecting body 84. The conductive portion 57 and the source line SL are connected via the connecting body 84.

In the connection region CR, a connecting body 85 is provided on the connecting body 81. For example, an interconnect 93 is provided on the connecting body 85. The connecting body 81 and the interconnect 93 are connected via the connecting body 85. The connecting bodies 82, 83, 84, and 85 are, for example, contact plugs.

Figure 23:
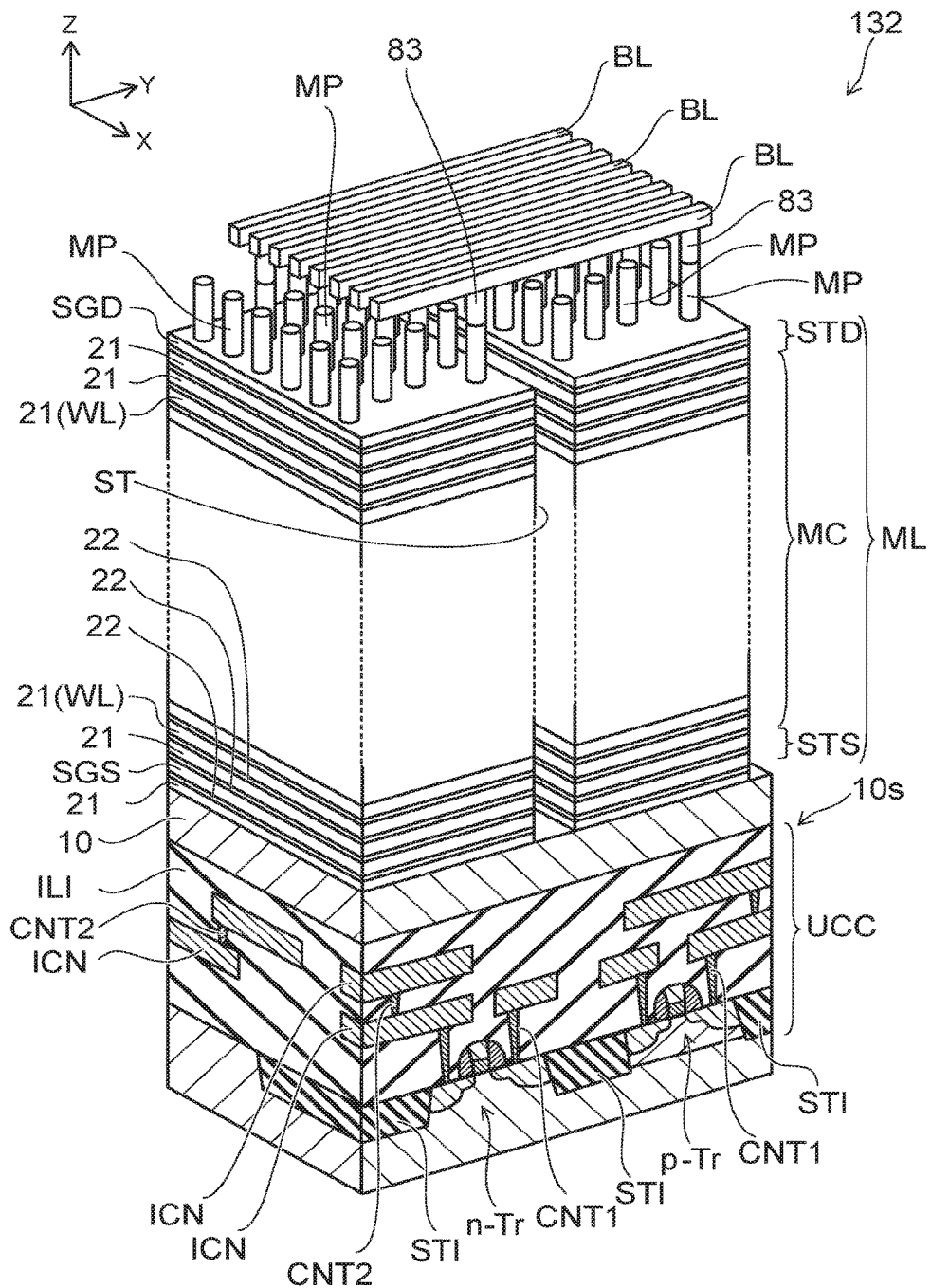
FIG. 23 is a schematic perspective view illustrating the semiconductor memory device according to the embodiment.

FIG. 23 is a schematic perspective view illustrating the semiconductor memory device according to the embodiment.

In the semiconductor memory device 132 as shown in FIG. 23, the base semiconductor layer 10 is provided in the upper portion of a silicon substrate 10s; and the stacked body ML is provided on the base semiconductor layer 10. The source-side selection transistor STS is provided in the lower portion of the stacked body ML; and the drain-side selection transistor STD is provided in the upper portion. The multiple pillar-shaped structure bodies MP extend through the stacked body ML. The pillar-shaped structure bodies MP include the memory layer 54 and the semiconductor body 50. In the drawing, a slit ST is provided between two stacked bodies ML; and the conductive portion 57 recited above (not illustrated in FIG. 18) is provided in the slit ST. The source line SL is not illustrated in the drawing.

In the silicon substrate 10s, the base semiconductor layer 10 is provided on an inter-layer insulating film ILI. The inter-layer insulating film ILI includes, for example, silicon oxide. An under-cell circuit UCC (e.g., a peripheral circuit) is provided in the silicon substrate 10s. The under-cell circuit UCC includes a drive circuit. For example, the drive circuit performs the programming, reading, and erasing of the data to and from the transistors of the memory cells MC. For example, the under-cell circuit UCC includes a sense amplifier.

For example, the silicon substrate 10s is subdivided into multiple active areas by an insulating portion STI (Shallow Trench Isolation). In one active area, an n-type transistor n-Tr (a MOSFET (Metal-Oxide-Semiconductor Field-Effect Transistor)) is provided. In one other active area, a p-type transistor p-Tr (a MOSFET) is provided. Multiple interconnects ICN are provided in multilayers inside the inter-layer insulating film ILI. Further, connection members CNT1 that connect the multiple interconnects ICN to the silicon substrate 10s are provided. Further, connection members CNT2 that connect the multiple interconnects ICN to each other are provided.

In the semiconductor memory device 132, because the under-cell circuit UCC (e.g., the peripheral circuit) is provided in the portion under the memory cells MC, the surface area of the semiconductor memory device 132 can be reduced. In the semiconductor memory device 132, any embodiment recited above or a modification of the embodiment is applicable to the configuration of the memory region MR.

According to the embodiments, a semiconductor memory device can be provided in which a reduction of the device surface area is possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive layers, insulating layers, memory cells, semiconductor bodies, memory layers, conductive portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices practicable by an appropriate design modification by one skilled in the art based on the semiconductor memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a first conductive layer including
      a first extension region extending in a first direction,
      a second extension region extending in the first direction and being arranged with the first extension region in the first direction,
      a third extension region extending in the first direction and being arranged with the first extension region in a second direction crossing the first direction,
      a fourth extension region extending in the first direction, being arranged with the third extension region in the first direction, and being arranged with the second extension region in the second direction, and
      a first connection region connected to a portion between the first extension region and the second extension region and to a portion between the third extension region and the fourth extension region;
   a first semiconductor body extending through the first extension region along a third direction crossing the first direction and the second direction;
   a second semiconductor body extending through the third extension region along the third direction;
   a first memory layer provided between the first semiconductor body and the first extension region; and
   a second memory layer provided between the second semiconductor body and the third extension region.

2. The semiconductor memory device according to claim 1, further comprising:
   a first structure body including a first extension insulating region, the first extension insulating region extending in the first direction and being provided between the first extension region and the third extension region; and
   a second structure body including a second extension insulating region, the second extension insulating region extending in the first direction and being provided between the second extension region and the fourth extension region.

3. The semiconductor memory device according to claim 2, wherein the first extension insulating region includes a material included in the first memory layer.

4. The semiconductor memory device according to claim 2, wherein
   the first structure body further includes:
      a third extension insulating region extending in the first direction and being provided between the first extension insulating region and the third extension region; and
      a first extension conductive layer extending in the first direction and being provided between the first extension insulating region and the third extension insulating region, and
   the second structure body further includes:
      a fourth extension insulating region extending in the first direction and being provided between the second extension insulating region and the fourth extension region; and
      a second extension conductive layer extending in the first direction and being provided between the second extension insulating region and the fourth extension insulating region.

5. The semiconductor memory device according to claim 4, wherein the third extension insulating region includes a material included in the first memory layer.

6. The semiconductor memory device according to claim 4, wherein
   the first structure body further includes a first connection region-side insulating region provided between the first extension conductive layer and the first connection region, and
   the second structure body further includes a second connection region-side insulating region provided between the second extension conductive layer and the first connection region.

7. The semiconductor memory device according to claim 6, wherein the first connection region-side insulating region includes a material included in the first memory layer.

8. The semiconductor memory device according to claim 1, wherein the first conductive layer further includes an end portion connection region connected to the first extension region and the third extension region.

9. The semiconductor memory device according to claim 8, wherein a position in the first direction of the first semiconductor body is between a position in the first direction of the first connection region and a position in the first direction of the end portion connection region.

10. The semiconductor memory device according to claim 1, further comprising a second conductive layer,
    the second conductive layer including:
       a fifth extension region extending in the first direction and being separated from the first extension region in the third direction;
       a sixth extension region extending in the first direction, being separated from a portion of the second extension region in the third direction, and being arranged with the fifth extension region in the first direction;
       a seventh extension region extending in the first direction, being separated from the third extension region in the third direction, and being arranged with the fifth extension region in the second direction;
       an eighth extension region extending in the first direction, being separated from a portion of the fourth extension region in the third direction, being arranged with the seventh extension region in the first direction, and being arranged with the sixth extension region in the second direction; and a second connection region connected to a portion between the fifth extension region and the sixth extension region and to a portion between the seventh extension region and the eighth extension region, the first semiconductor body further extending through the fifth extension region along the third direction, the second semiconductor body further extending through the seventh extension region along the third direction, a first structure body extending between the fifth extension region and the seventh extension region, a second structure body extending between the sixth extension region and the eighth extension region.

11. The semiconductor memory device according to claim 10, wherein at least a portion of the second connection region overlaps at least a portion of the first connection region in the third direction.

12. The semiconductor memory device according to claim 10, wherein the second extension region includes a second extension region end portion having a side surface crossing the first direction, the sixth extension region includes a sixth extension region end portion having a side surface crossing the first direction, and a first distance between the second extension region end portion and the first semiconductor body is longer than a second distance between the sixth extension region end portion and the first semiconductor body.

13. The semiconductor memory device according to claim 1, further comprising:

a third conductive layer extending in the first direction and being separated from a portion of the first extension region in the third direction; and a fourth conductive layer extending in the first direction and being separated from a portion of the third extension region in the third direction, the first semiconductor body extending through the third conductive layer along the third direction, the second semiconductor body extending through the fourth conductive layer along the third direction.

14. The semiconductor memory device according to claim 13, wherein the portion between the first extension region and the second extension region does not overlap the third conductive layer in the third direction, and the portion between the third extension region and the fourth extension region does not overlap the fourth conductive layer in the third direction.

15. The semiconductor memory device according to claim 13, wherein the second extension region includes a second extension region end portion having a side surface crossing the first direction, the third conductive layer includes a third conductive layer end portion having a side surface crossing the first direction, and a first distance between the second extension region end portion and the first semiconductor body is longer than a third distance between the third conductive layer end portion and the first semiconductor body.

16. The semiconductor memory device according to claim 13, further comprising a second conductive layer, the second conductive layer including:

a fifth extension region extending in the first direction and being separated from the first extension region in the third direction;

a sixth extension region extending in the first direction, being separated from a portion of the second extension region in the third direction, and being arranged with the fifth extension region in the first direction;

a seventh extension region extending in the first direction, being separated from the third extension region in the third direction, and being arranged with the fifth extension region in the second direction;

an eighth extension region extending in the first direction, being separated from a portion of the fourth extension region in the third direction, being arranged with the seventh extension region in the first direction, and being arranged with the sixth extension region in the second direction; and a second connection region connected to a portion between the fifth extension region and the sixth extension region and to a portion between the seventh extension region and the eighth extension region, the first semiconductor body further extending through the fifth extension region along the third direction, the second semiconductor body further extending through the seventh extension region along the third direction, a first structure body extending between the fifth extension region and the seventh extension region, a second structure body extending between the sixth extension region and the eighth extension region, a portion of the fifth extension region being positioned between the third conductive layer and the portion of the first extension region, a portion of the seventh extension region being positioned between the fourth conductive layer and the portion of the third extension region.

17. The semiconductor memory device according to claim 13, wherein a first structure body extends between the third conductive layer and the fourth conductive layer.

18. The semiconductor memory device according to claim 10, wherein the sixth extension region includes a sixth extension region end portion having a side surface crossing the first direction, the eighth extension region includes an eighth extension region end portion having a side surface crossing the first direction, and a second distance between the sixth extension region end portion and the first semiconductor body is shorter than a distance in the first direction between a position in the first direction of the eighth extension region end portion and a position in the first direction of the first semiconductor body.

19. The semiconductor memory device according to claim 10, further comprising a first connecting body extending in the third direction and being electrically connected to the second extension region, the second extension region including a second extension region end portion having a side surface crossing the first direction, a position in the first direction of the first connecting body being between a position in the first direction of the second extension region end portion and a position in the first direction of the first semiconductor body.

20. The semiconductor memory device according to claim 19, further comprising a second connecting body extending in the third direction and being electrically connected to the eighth extension region,
- the sixth extension region including a sixth extension region end portion having a side surface crossing the first direction,
- the position in the first direction of the sixth extension region end portion being between a position in the first direction of the second connecting body and the position in the first direction of the first semiconductor body.

* * * * *